(12) United States Patent
Fukamachi et al.

(10) Patent No.: US 8,036,148 B2
(45) Date of Patent: Oct. 11, 2011

(54) HIGH-FREQUENCY CIRCUIT, HIGH-FREQUENCY DEVICE AND COMMUNICATIONS APPARATUS

(75) Inventors: Keisuke Fukamachi, Kumagaya (JP); Shigeru Kemmochi, Kumagaya (JP); Kazuhiro Hagiwara, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 121 days.

(21) Appl. No.: 12/300,308

(22) PCT Filed: May 8, 2007

(86) PCT No.: PCT/JP2007/059533
§ 371 (c)(1),
(2), (4) Date: Nov. 10, 2008

(87) PCT Pub. No.: WO2007/129716
PCT Pub. Date: Nov. 15, 2007

(65) Prior Publication Data
US 2009/0207764 A1 Aug. 20, 2009

(30) Foreign Application Priority Data

| May 8, 2006 | (JP) | 2006-128830 |
| Jun. 23, 2006 | (JP) | 2006-173701 |
| Jun. 23, 2006 | (JP) | 2006-173702 |
| Sep. 21, 2006 | (JP) | 2006-255125 |

(51) Int. Cl.
*H04B 1/44* (2006.01)
(52) U.S. Cl. ....................... 370/282; 370/297
(58) Field of Classification Search .............. 370/282, 370/293, 297, 319, 321, 343; 333/33, 35, 333/128, 204, 189, 190, 193, 26; 455/73, 455/76, 77, 78, 80, 81, 82, 83, 84, 85, 86
See application file for complete search history.

(56) References Cited

U.S. PATENT DOCUMENTS

| 5,906,820 | A | 5/1999 | Bacha |
| 7,251,459 | B2 * | 7/2007 | McFarland et al. ........... 455/101 |
| 2004/0087286 | A1 | 5/2004 | Inoue et al. |

(Continued)

FOREIGN PATENT DOCUMENTS
JP 08-316870 A 11/1996
(Continued)

*Primary Examiner* — Huy Vu
*Assistant Examiner* — Dady Chery
(74) *Attorney, Agent, or Firm* — Sughrue Mion, PLLC

(57) ABSTRACT

A high-frequency circuit for wireless communications selectively using a first frequency band and a second frequency band lower than the first frequency band, comprising an antenna terminal; first and second transmission terminals to which transmitting signals in the first and second frequency bands are input; first and second receiving terminals from which received signals in the first and second frequency bands are output; a diplexer circuit for branching a first-frequency-band-signal path and a second-frequency-band-signal path; a switch circuit for switching a path for a transmitting signal and a path for a received signal; a low-noise amplifier circuit disposed between the switch circuit and the second receiving terminal for amplifying a received signal in the second frequency band; and first and second filter circuits disposed between the antenna terminal and the low-noise amplifier circuit in this order from the antenna terminal, both filter circuits passing a received signal in the second frequency band but blocking a frequency band lower than the second frequency band, and the band blocked by the first filter circuit being lower than the band blocked by the second filter circuit.

20 Claims, 25 Drawing Sheets

U.S. PATENT DOCUMENTS

| | | | |
|---|---|---|---|
| 2004/0127182 A1* | 7/2004 | Hayashi | 455/193.1 |
| 2004/0266378 A1 | 12/2004 | Fukamachi et al. | |
| 2008/0012662 A1* | 1/2008 | Hernandez et al. | 333/204 |

FOREIGN PATENT DOCUMENTS

| | | |
|---|---|---|
| JP | 2002-208874 A | 7/2002 |
| JP | 2002-335187 A | 11/2002 |
| JP | 2003-152588 A | 5/2003 |
| JP | 2003-273687 A | 9/2003 |
| JP | 2004-072586 A | 3/2004 |
| JP | 2004-312363 A | 11/2004 |
| JP | 2005-260837 A | 9/2005 |
| JP | 2005-269305 A | 9/2005 |
| JP | 2006-109257 A | 4/2006 |
| WO | 2006/003959 A | 1/2006 |

* cited by examiner

HIGH-FREQUENCY CIRCUIT, HIGH-FREQUENCY DEVICE AND COMMUNICATIONS APPARATUS

CROSS REFERENCE TO RELATED APPLICATIONS

This application is a National Stage of International Application No. PCT/JP2007/059533 filed May 8, 2007, claiming priority based on Japanese Patent Application No. 2006-128830 filed May 8, 2006, Japanese Patent Application No. 2006-173701 filed Jun. 23, 2006, Japanese Patent Application No. 2006-173702 filed Jun. 23, 2006 and Japanese Patent Application No. 2006-255125 filed Sep. 21, 2006, the contents of all of which are incorporated herein by reference in their entirety.

FIELD OF THE INVENTION

The present invention relates to a high-frequency circuit commonly usable in at least two communications systems, a high-frequency device having such high-frequency circuit, and a communications apparatus comprising it.

BACKGROUND OF THE INVENTION

Data communications by wireless LAN such as IEEE802.11 are now widely used, for instance, in personal computers (PCs), PC peripherals such as printers, hard disk drives and broadband routers, electronic apparatuses such as FAXs, refrigerators, standard televisions (SDTVs), high-definition televisions (HDTVs), digital cameras, digital video cameras and mobile phones, signal-transmitting means in automobiles and aircrafts, etc.

As the wireless LAN standard, IEEE802.11a uses an orthogonal frequency division multiplexing (OFDM) modulation system in a frequency band of 5 GHz, supporting high-speed data communications of maximum 54 Mbps. IEEE802.11b uses a direct sequence spread spectrum (DSSS) system in an industrial, scientific and medical (ISM) band of 2.4 GHz usable without a wireless license, supporting high-speed communications of 5.5 Mbps and 11 Mbps. IEEE802.11g uses the OFDM modulation system in a 2.4-GHz band like IEEE802.11b, supporting high-speed data communications of maximum 54 Mbps.

As a high-frequency circuit for use in a multi-band communications apparatus using such wireless LAN, WO2006/003959A discloses a high-frequency circuit capable of performing diversity reception in a multiband communications apparatus for two communications systems (IEEE 802.11a and IEEE 802.11b) of a 2.4-GHz band and a 5-GHz band in wireless LAN. This high-frequency circuit comprises, as shown in FIG. 35, a diplexer circuit 13 between a high-frequency switch circuit 10 and a transmission circuit;
a power amplifier circuit 2 and a bandpass filter circuit 4 between the diplexer circuit 13 and a transmission terminal 11$bg$-T;
a lowpass filter circuit 19, a power amplifier circuit 3 and a bandpass filter circuit 5 between the diplexer circuit 13 and a transmission terminal 11$a$-T;
a detection circuit 8 between the high-frequency switch circuit 10 and the diplexer circuit 13;
a diplexer circuit 14 between the high-frequency switch circuit 10 and a receiving circuit;
a bandpass filter circuit 6 between the diplexer circuit 14 and a receiving terminal 11$bg$-R;
a lowpass filter circuit 26 and a low-noise amplifier circuit 27 between the diplexer circuit 14 and a receiving terminal 11$a$-R;
a notch circuit 28 between an antenna terminal Ant1 and the high-frequency switch circuit 10; and
a notch circuit 29 between an antenna terminal Ant2 and the high-frequency switch circuit 10.

WO 2006/003959 also discloses an example comprising low-noise amplifier circuits in paths connected to a receiving terminal 11$bg$-R for a 2.4-GHz band and a receiving terminal 11$a$-R for a 5-GHz band. In the high-frequency circuit of WO 2006/003959, the diplexer circuit is disposed on the input side of the low-noise amplifier, and the bandpass filter or the lowpass filter is connected between the diplexer circuit and the low-noise amplifier.

As a high-frequency circuit commonly usable for wireless LAN and Bluetooth, JP2002-208874A discloses, as shown in FIG. 36, a high-frequency circuit comprising a bandpass filter 2 between an antenna 1 and an antenna switch 3, a power amplifier circuit 5 disposed on the transmission side of the antenna switch 3 for being commonly used for wireless LAN and Bluetooth, a diplexer (combination of a lowpass matching circuit 13 and a highpass matching circuit 14) connected to the power amplifier circuit 5 for branching transmission for wireless LAN and transmission for Bluetooth, a low-noise amplifier 7 disposed on the receiving side of the antenna switch 3 for being commonly used for wireless LAN and Bluetooth, and a diplexer (combination of a lowpass matching circuit 15 and a highpass matching circuit 16) connected to the low-noise amplifier 7 for branching reception for wireless LAN and reception for Bluetooth.

The receiving sensitivity is largely influenced by the noise index of a low-noise amplifier and the insertion loss of a bandpass filter and a diplexer circuit. With respect to the reduction of the noise index of the low-noise amplifier, minimizing loss in its input stage is most effective. However, the structure of the high-frequency circuit of WO 2006/003959 fails to obtain sufficient improvement in the receiving sensitivity. Also, because a switch circuit, etc. are vulnerable to electrostatic surge, the switch circuit, etc. are likely broken in the circuit structure of WO 2006/003959, when electrostatic discharge (ESD) is applied to the antenna.

In the high-frequency circuit of WO 2006/003959, bias voltage of about several mA should be supplied to the power amplifier circuit and the low-noise amplifier circuit, but a logic control power supply integrated with an RFIC or a baseband IC cannot directly be driven because its driving current is 2 mA or less.

In the high-frequency circuit of JP 2003-273687 A, the highpass filter circuit is connected to the antenna terminal to prevent the breakage of the switch circuit, etc. by electrostatic discharge. However, when the function of transmitting and receiving a wireless LAN is added to a mobile gear such as a cell phone, part of a transmitting signal for the mobile gear is likely to enter the wireless LAN system, saturating particularly a low-noise amplifier in a receiving path, and thus deteriorating the receiving sensitivity. The circuit structure of JP 2003-273687 A coping with electrostatic discharge cannot fully solve such problem. In the high-frequency circuit of JP 2002-208874 A, one bandpass filter disposed between an antenna and an antenna switch conducts the reduction of harmonics generated on the transmission side and the attenuation of noise on the receiving side, but it cannot be used commonly for two frequencies of a 2.4-GHz band and a 5-GHz band.

Further, wireless LAN communications apparatuses for IEEE 802.11n according to a multi-input-multi-output (MIMO) technology for increasing the speed and quality of communications by using pluralities of antennas have been finding wider applications. However, the high-frequency circuits of WO 2006/003959 and JP 2003-273687 A cannot fully handle IEEE 802.11n.

OBJECT OF THE INVENTION

Accordingly, an object of the present invention is to provide a high-frequency circuit usable in wireless communications selectively using at least two frequency bands, with good receiving sensitivity and small current consumption.

Another object of the present invention is to provide a high-frequency device having such a high-frequency circuit.

A further object of the present invention is to provide a communications apparatus comprising such a high-frequency device.

DISCLOSURE OF THE INVENTION

The high-frequency circuit of the present invention for use in wireless communications selectively using at least a first frequency band and a second frequency band lower than the first frequency band, comprises an antenna terminal;
a first transmission terminal to which a transmitting signal in the first frequency band is input;
a second transmission terminal to which a transmitting signal in the second frequency band is input;
a first receiving terminal from which a received signal in the first frequency band is output;
a second receiving terminal from which a received signal in the second frequency band is output;
at least one diplexer circuit for branching a first-frequency-band-signal path and a second-frequency-band-signal path;
at least one switch circuit for switching a path for a transmitting signal and a path for a received signal;
a low-noise amplifier circuit disposed between the switch circuit and the second receiving terminal for amplifying at least a received signal in the second frequency band; and
at least first and second filter circuits disposed between the antenna terminal and the low-noise amplifier circuit in this order from the antenna terminal;
both filter circuits passing a received signal in the second frequency band but blocking at least a frequency band lower than the second frequency band; and a band blocked by the first filter circuit being lower than a band blocked by the second filter circuit.

The band lower than the high-frequency signal contains not only electrostatic discharge but also noise and unnecessary waves adversely affecting the switch circuit and the low-noise amplifier circuit. The first filter circuit prevents not only electrostatic discharge (ESD) applied to the antenna from causing the breakage of the switch circuit, etc., but also signals interfering in the antenna from saturating the low-noise amplifier circuit. Further, the first filter can attenuating signals of, for instance, 1 GHz or less. For instance, these functions make it possible to prevent interference from an EGSM system using a 0.9-GHz band and outputting as high power as about 3 W at maximum, etc. The first filter circuit near the antenna terminal blocks unnecessary, relatively low-frequency waves such as electrostatic discharge, etc., and the second filter circuit near the low-noise amplifier circuit prevents the saturation of the low-noise amplifier.

Although the blocking of unnecessary waves with one filter increases insertion loss, a combination of the first filter and the second filter circuit can block unnecessary waves stepwise. With the band blocked by the first filter circuit lower than the band blocked by the second filter circuit, loss can be suppressed in signals passing through the first filter circuit. In order that the second filter blocks unnecessary waves having frequencies lower than the second frequency band from entering the low-noise amplifier circuit as much as possible, the second filter preferably has a higher Q value than that of the first filter. It should be noted that a diplexer circuit is not contained in the first and second filters.

The first and second filter circuits are preferably highpass filter circuits. Because signal loss can be smaller in a highpass filter circuit than in a bandpass filter circuit, the highpass filter is preferable to suppress the signal loss. The highpass filter can be commonly used in the first and second frequency bands in a high-frequency circuit for multiband wireless communications, in which first and second frequency bands are widely separate from each other, like a wireless LAN using a 2.4-GHz band and a 5-GHz band separate from each other by 2 GHz or more.

The above high-frequency circuit preferably comprises
a switch circuit for switching the connection of the antenna terminal to the first and second transmission terminals and the connection of the antenna terminal to the first and second receiving terminals;
a first diplexer circuit disposed between the switch circuit and the first and second transmission terminals;
a second diplexer circuit disposed between the switch circuit and the first and second receiving terminals;
a first power amplifier circuit disposed between the first diplexer circuit and the first transmission terminal;
a second power amplifier circuit disposed between the first diplexer circuit and the second transmission terminal;
the first filter circuit being disposed between the antenna terminal and the switch circuit, and the second filter circuit being disposed between the switch circuit and the low-noise amplifier circuit.

The highpass filter circuit, which is the first filter circuit, prevents not only electrostatic discharge (ESD) applied to the antenna from causing the breakage of the switch circuit, etc., but also signals interfering the antenna from saturating the low-noise amplifier circuit. To prevent the saturation of the low-noise amplifier circuit, it is preferable to dispose the first filter circuit between the antenna terminal and the switch circuit, and a highpass filter circuit, which is the second filter circuit, between the switch circuit and the low-noise amplifier circuit.

The low-noise amplifier circuit is preferably disposed between the switch circuit and the second diplexer circuit. Because there is no diplexer circuit on the input side of the low-noise amplifier in this arrangement, insertion loss on the input side can be reduced greatly, thereby drastically improving receiving sensitivity.

The high-frequency circuit preferably comprises a bypass parallel-connected to the low-noise amplifier circuit. When the low-noise amplifier circuit is put in an operating state with the bypass provided with high isolation at a weak received signal, a high receiving sensitivity is obtained. Also, when the low-noise amplifier circuit is put in an unoperating state with the bypass connected at a strong received signal, the distortion of the received signal is suppressed.

The second filter circuit is preferably disposed between a branching point of the bypass and the low-noise amplifier circuit, and the low-noise amplifier circuit. With this circuit structure, the bypass has such small insertion loss that it can handle even a small received signal. Accordingly, the received signal strength can be made smaller during the operation of the low-noise amplifier circuit, to reduce the distortion of the received signal.

The above high-frequency circuit preferably comprises a voltage-applying terminal for applying constant voltage to the first and second power amplifier circuits, and a control circuit receiving voltage from the voltage-applying terminal to output a control bias voltage to the first and second power amplifier circuits and the low-noise amplifier circuit. The control circuit can perform control at as weak current as 1 mA or less without needing large bias current (several mA) unlike in conventional technologies, thereby contributing to low current consumption.

In an embodiment of the present invention, the control circuit preferably comprises a voltage-inputting terminal, a terminal for outputting bias voltage for the first power amplifier circuit, a terminal for outputting bias voltage for the second power amplifier circuit, a terminal for outputting bias voltage for the low-noise amplifier circuit, a first switch for turning on or off bias voltage for the first power amplifier circuit, a second switch for turning on or off bias voltage for the second power amplifier circuit, a third switch for turning on or off bias voltage for the low-noise amplifier circuit, a fourth switch disposed between a common terminal of the first and second switches and the voltage-inputting terminal, a resistor parallel-connected to the fourth switch, and first to fourth signal-inputting terminals for the ON/OFF control of the first to fourth switches. The control circuit can be operated by voltage from one voltage-inputting terminal, to output bias voltage for the first and second power amplifier circuits and bias voltage for the low-noise amplifier circuit by switch control. A signal for controlling the switch can be obtained from a logic control terminal integrated in an RFIC, a baseband IC, etc.

With a resistor parallel-connected to the fourth switch having higher resistance than that of the fourth switch in an ON state, the fourth switch can set the bias voltage of the power amplifier circuit high when it is in an ON state providing low resistance, and low by passing through the parallel-connected resistor when it is in an OFF state. This makes the operating point of the power amplifier circuit variable, so that the bias voltage can be made higher to increase the output of the power amplifier circuit when a communication range is expanded, or when there is a poor communications environment. On the contrary, when a communication range is relatively narrow, or when there is a good communications environment, the bias voltage can be made lower to reduce current consumption.

A resistor can be disposed between each of the first to third switches and each bias-voltage-outputting terminal to adjust the output voltage.

The high-frequency circuit preferably comprises the first lowpass filter circuit between the first diplexer circuit and the first power amplifier circuit, and the second lowpass filter circuit between the first diplexer circuit and the second power amplifier circuit. With these lowpass filter circuits, harmonics generated from the power amplifier circuits can be reduced.

Instead of having the low-noise amplifier circuit between the switch circuit and the second diplexer circuit, the high-frequency circuit may comprise another low-noise amplifier circuit between the switch circuit and the first receiving terminal for amplifying a received signal in the first frequency band, with the second diplexer circuit disposed between the low-noise amplifier circuit and the another low-noise amplifier circuit and the switch circuit. In this structure, the low-noise amplifier circuit is not required to have high flatness in gain characteristics, but need only amplify a signal in the first or second frequency band, resulting in high gain.

The first filter circuit may be a highpass filter circuit, and the second filter circuit may be a bandpass filter circuit. The bandpass filter circuit can also attenuating unnecessary, low-frequency waves, thereby preventing the saturation of the low-noise amplifier circuit.

The above high-frequency circuit preferably comprises
  a switch circuit for switching the connection of the antenna terminal to the first and second transmission terminals and the connection of the antenna terminal to the first and second receiving terminals,
  a first diplexer circuit disposed between the switch circuit and the first and second transmission terminals;
  a second diplexer circuit disposed between the switch circuit and the first and second receiving terminals;
  a first power amplifier circuit disposed between the first diplexer circuit and the first transmission terminal;
  a second power amplifier circuit disposed between the first diplexer circuit and the second transmission terminal;
  a first low-noise amplifier circuit disposed between the second diplexer circuit and the first receiving terminal; and
  a second low-noise amplifier circuit disposed between the second diplexer circuit and the second receiving terminal for amplifying a received signal in the second frequency band;
the first filter circuit being disposed between the antenna terminal and the switch circuit, and the second filter circuit being disposed between the second diplexer circuit and the second low-noise amplifier circuit.

With a bandpass filter circuit as the second filter circuit disposed on the input side of the second low-noise amplifier circuit handling a low frequency band, high attenuation characteristics can be obtained by in a frequency lower than the second frequency band. Thus, interfering radio waves of 2 GHz or less generated from a mobile gear, etc. can be removed by a bandpass filter, for instance, in a wireless LAN having a second frequency band of 2.4 GHz, thereby preventing the saturation of the second low-noise amplifier circuit. On the other hand, the second diplexer circuit is disposed on the input side of the first low-noise amplifier circuit handling a high frequency band. Because a diplexer circuit has a filtering characteristic of attenuating 2.5 GHz or less but passing a 5-GHz band, the first frequency band, in the case of wireless LAN, interfering radio waves of 2 GHz or less generated from mobile gears, etc. are removed by the first diplexer circuit, thereby suppressing the saturation of the first low-noise amplifier circuit. Further, because a bandpass filter having relatively large insertion loss need not be used on the input side of the first low-noise amplifier circuit, the receiving sensitivity of the first frequency band can be improved.

The high-frequency circuit preferably comprises a bandpass filter circuit between the first low-noise amplifier circuit and the first receiving terminal. The bandpass filter circuit can remove harmonics from the output of the low-noise amplifier circuit.

The high-frequency circuit preferably comprises bandpass filter circuits each between the first power amplifier circuit and the first transmission terminal, and between the second power amplifier circuit and the second transmission terminal. With the bandpass filter circuit, unnecessary out-of-band noises can be removed from the transmitting signal.

The high-frequency circuit preferably comprises a voltage-applying terminal for applying constant voltage to the first and second power amplifier circuits, and a control circuit receiving voltage from the voltage-applying terminal to output control bias voltage to the first and second power amplifier circuits. The control circuit may further output control bias voltage to the first and second low-noise amplifier circuits. The control circuit can conduct the control at as weak current as 1 mA or less without needing large bias current (several mA) unlike in conventional technologies, contributing to the reduction of current consumption.

In another embodiment of the present invention, the control circuit preferably comprises a voltage-inputting terminal, a terminal for outputting bias voltage for the first power amplifier circuit, a terminal for outputting bias voltage for the second power amplifier circuit, a first switch for turning on or off bias voltage for the first power amplifier circuit, a second switch for turning on or off bias voltage for the second power amplifier circuit, a third switch disposed between a common terminal of the first and second switches and the voltage-inputting terminal, a resistor parallel-connected to the third switch, and first to third signal-inputting terminals for the ON/OFF control of the first to third switches. The control circuit may further comprise a terminal for outputting bias voltage for the first low-noise amplifier circuit, a terminal for outputting bias voltage for the second low-noise amplifier circuit, a fourth switch for turning on or off bias voltage for the first low-noise amplifier circuit, a fifth switch for turning on or off bias voltage for the second low-noise amplifier circuit, and fourth and fifth signal-inputting terminals for the ON/OFF control of the fourth and fifth switches.

The control circuit can be operated by voltage from one voltage-inputting terminal to output bias voltage for the first and second power amplifier circuits, and bias voltage for the first and second low-noise amplifier circuits by switch control. A signal for controlling the switch can be obtained from a logic control terminal integrated in an RFIC, a baseband IC, etc.

With a resistor parallel-connected to the third switch having higher resistance than that of the third switch in an ON state, the bias voltage to the power amplifier circuit is high because of low resistance of the third switch when the third switch is in an ON state, but low by passing the parallel resistor when the third switch is in an OFF state, thereby making the operating point of the power amplifier circuit variable. Accordingly, the bias voltage can be made higher to increase the output of the power amplifier circuit when a communication range is expanded, or when there is a poor communications environment. On the other hand, when a communication range is relatively narrow, or when there is a good communications environment, the bias voltage can be made lower to reduce current consumption. With a resistor between each of the first, second, fourth and fifth switches and each bias-voltage-outputting terminal, the output voltage can be adjusted.

A high-frequency circuit in which the first filter circuit is a highpass filter circuit, and the second filter circuit is a bandpass filter circuit, preferably comprises
- a diplexer circuit for branching a signal input from the antenna terminal to a circuit for the first frequency band and a circuit for the second frequency band, and transmitting signals from circuits for the first and second frequency bands to the antenna terminal;
- a first switch circuit disposed on the first frequency band circuit side of the diplexer circuit for switching a transmission path and a receiving path;
- a first power amplifier circuit disposed between the first switch circuit and the first transmission terminal;
- a first low-noise amplifier circuit disposed between the first switch circuit and the first receiving terminal;
- a second switch circuit disposed first on the second frequency band circuit side of the diplexer circuit for switching a transmission path and a receiving path;
- a second power amplifier circuit disposed between the second switch circuit and the second transmission terminal; and
- a second low-noise amplifier circuit disposed between the second switch circuit and the second receiving terminal for amplifying a received signal in the second frequency band;

the first filter being disposed between the antenna terminal and the diplexer circuit, and the second filter being disposed between the diplexer circuit and the second switch circuit.

Provided with a bandpass filter circuit as the second filter circuit on the input side, the second low-noise amplifier circuit handling a low frequency band has a high attenuation characteristic in a frequency lower than the second frequency band. In a wireless LAN having a second frequency band of 2.4 GHz, for instance, the second frequency band is close to a frequency band (about 2 GHz or less) of cell phones. Accordingly, radio waves of 2 GHz or less generated from cell phones can be removed by the bandpass filter circuit, to prevent the saturation of the second low-noise amplifier circuit. On the other hand, the first diplexer circuit is disposed on the input side of the first low-noise amplifier circuit handling a high frequency band. In the case of wireless LAN, the diplexer circuit has a filtering characteristic of attenuating 2.5 GHz or less but passing a 5-GHz band, the first frequency band. Because the high frequency band (5 GHz) of a wireless LAN is relatively separate from the frequency band (about 2 GHz or less) of cell phones, radio waves of 2 GHz or less generated from cell phones can be removed by the first diplexer circuit, to prevent the saturation of the first low-noise amplifier circuit. Further, because a bandpass filter having relatively large insertion loss need not be used on the input side of the first low-noise amplifier circuit, the receiving sensitivity of the first frequency band can be improved.

The high-frequency circuit preferably comprises bandpass filter circuits each between the first power amplifier circuit and the first transmission terminal, and between the first low-noise amplifier circuit and the first receiving terminal. With the bandpass filter circuit disposed between the first power amplifier circuit and the first transmission terminal, unnecessary out-of-band noises can be removed from the transmitting signal. With the bandpass filter circuit disposed between the first low-noise amplifier circuit and the first receiving terminal, harmonics can be removed from the output of the low-noise amplifier circuit.

The high-frequency circuit preferably comprises a voltage-applying terminal for applying constant voltage to the first and second power amplifier circuits, and a control circuit receiving voltage from the voltage-applying terminal to output control bias voltage to the first and second power amplifier circuits. The control circuit may have a structure of outputting control bias voltage to the first and second low-noise amplifier circuits. The control circuit can conduct the control at as weak current as 1 mA or less without needing large bias current (several mA) unlike in conventional technologies, thereby contributing to the reduction of current consumption.

In a further embodiment of the present invention, the control circuit preferably comprises a voltage-inputting terminal, a terminal for outputting bias voltage for the first power amplifier circuit, a terminal for outputting bias voltage for the second power amplifier circuit, a first switch for turning on or off bias voltage for the first power amplifier circuit, a second switch for turning on or off bias voltage for the second power amplifier circuit, a third switch disposed between a common terminal of the first and second switches and the voltage-inputting terminal, a resistor parallel-connected to the third switch, and first to third signal-inputting terminals for the ON/OFF control of the first to third switches. This control circuit may further contain a terminal for outputting bias voltage for the first low-noise amplifier circuit, a terminal for outputting bias voltage for the second low-noise amplifier circuit, a fourth switch for turning on or off bias voltage for the first low-noise amplifier circuit, a fifth switch for turning on or off bias voltage for the second low-noise amplifier circuit, and fourth and fifth signal-inputting terminals for the ON/OFF control of the fourth and fifth switches. The control circuit can be operated by voltage from one voltage-inputting terminal to output bias voltage for the first and second power amplifier circuits and bias voltage the first and second low-noise amplifier circuits by switch control. A signal for controlling the switch can be obtained from a logic control terminal integrated in an RFIC, a baseband IC, etc.

With a resistor parallel-connected to the third switch having higher resistance than that of the third switch in an ON state, the bias voltage of the power amplifier circuit is high because of low resistance of the third switch when the third switch is in an ON state, and low by passing through the parallel resistor when the third switch is in an OFF state, thereby making the operating point of the power amplifier circuit variable. Accordingly, the bias voltage can be made higher to increase the output of the power amplifier circuit, when a communication range is expanded, or when there is a poor communications environment, etc. On the other hand, when a communication range is relatively narrow, or when there is a good communications environment, the bias voltage can be made lower to reduce current consumption. With a resistor disposed between each of the first, second, fourth and fifth switches and each bias-voltage-outputting terminal, the output voltage can be adjusted.

The high-frequency device of the present invention having the above high-frequency circuit comprises an integral laminate comprising pluralities of dielectric ceramic layers provided with electrode patterns, and devices mounted on the laminate, the first and second diplexer circuits being constituted by the electrode patterns in the laminate, and semiconductor devices for the switch circuits, the first and second power amplifier circuits and the low-noise amplifier circuits being mounted on the laminate. This structure miniaturizes the high-frequency device with reduced insertion loss due to wiring resistance. Semiconductor devices for the control circuit may be mounted on the laminate.

The communications apparatus of the present invention comprises the above high-frequency device.

DESCRIPTION OF THE BEST MODE OF THE INVENTION

Figure 1:
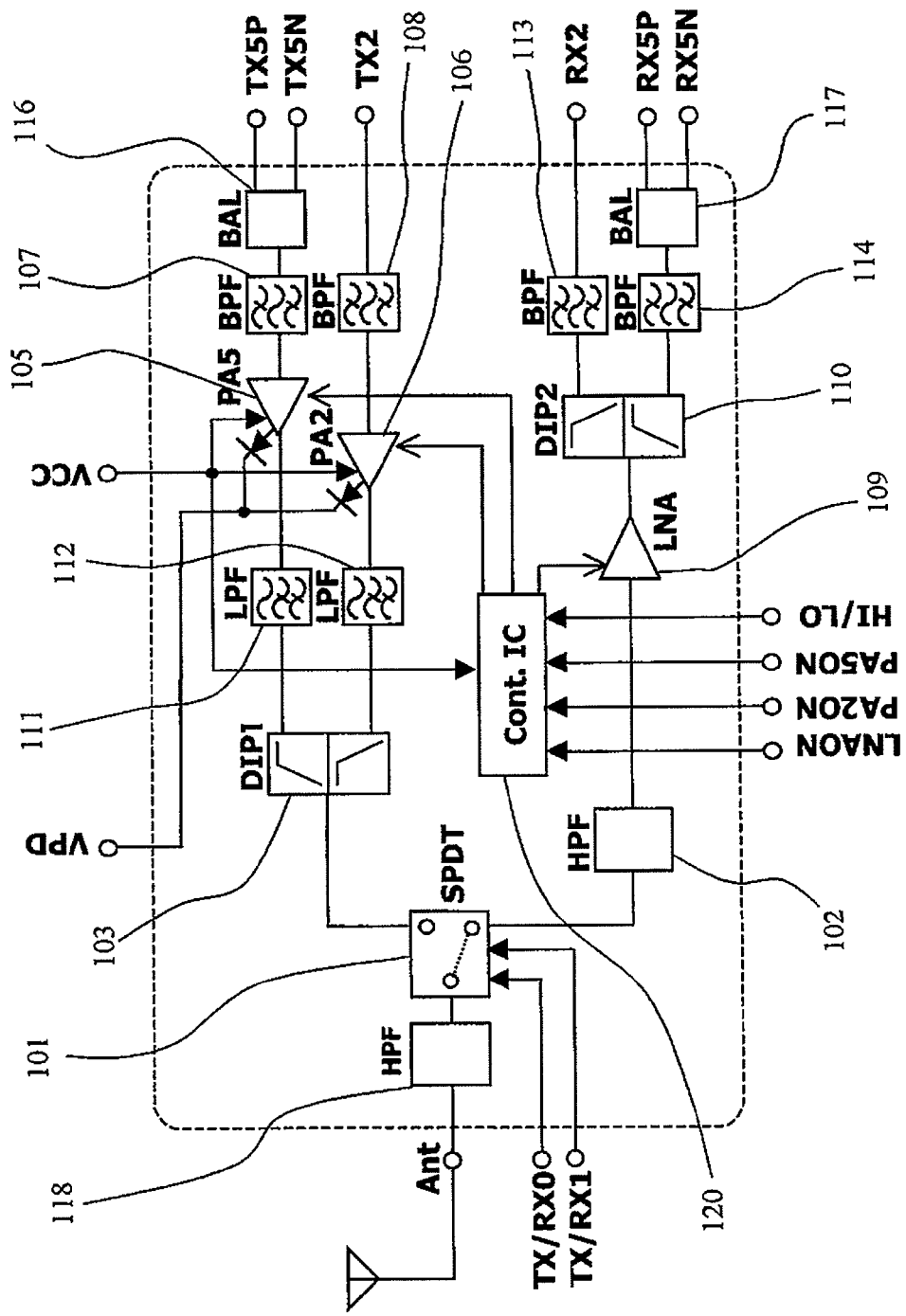
FIG. 1 is a block diagram showing a high-frequency circuit according to the first embodiment of the present invention.

The high-frequency circuit of the present invention for wireless communications selectively using a first frequency band and a second frequency band lower than the first frequency band comprises an antenna terminal, a first transmission terminal to which a transmitting signal in the first frequency band is input, a second transmission terminal to which a transmitting signal in the second frequency band is input, a first receiving terminal from which a received signal in the first frequency band is output, and a second receiving terminal from which a received signal in the second frequency band is output. It further comprises at least one branching circuit (diplexer circuit) for branching a first-frequency-band-signal path and a second-frequency-band-signal path, and at least one switch circuit for switching a transmitting signal path and a received signal path, thereby having a path from the antenna terminal to the first transmission terminal, a path from the antenna terminal to the second transmission terminal, a path from the antenna terminal to the first receiving terminal, and a path from the antenna terminal to the second receiving terminal.

When the switch circuit for switching a transmitting signal path and a received signal path is commonly used in the first and second frequency bands, one switch circuit switches the connection to the first and second transmission terminals or the first and second receiving terminals. In this case, the first diplexer circuit is disposed in a transmission path downstream of the switch circuit, and the second diplexer circuit is disposed in a receiving path downstream of the switch circuit, such that they act as a first-frequency-band-signal path and a second-frequency-band-signal path. On the other hand, when separate switch circuits for switching a transmitting signal path and a received signal path are used in the first and second frequency bands, the signal path is branched by one diplexer circuit to a first-frequency-band-signal path and a second-frequency-band-signal path, and switch circuits each connected in the first-frequency-band-signal path and the second-frequency-band-signal path switch the connection to the first transmission terminal or the first receiving terminal, and the connection to the second transmission terminal or the second receiving terminal.

At least a low-noise amplifier circuit for amplifying a received signal in the second frequency band is disposed between the switch circuit and the second receiving terminal. When the low-noise amplifier circuit is disposed between the switch circuit and the first receiving terminal, another low-noise amplifier circuit may be disposed in addition to such low-noise amplifier circuit, or the low-noise amplifier circuit for amplifying a received signal in the second frequency band may be shared.

Further, to pass a received signal in the second frequency band while blocking unnecessary waves having lower frequencies than the second frequency band, the first filter circuit near the antenna terminal and the second filter circuit near the low-noise amplifier circuit are disposed between the antenna terminal and the low-noise amplifier circuit. The first and second filter circuits need only be arranged via the switch circuit and/or the diplexer circuit. A band blocked by the first filter circuit has a lower frequency than that of a band blocked by the second filter circuit. Many signals having different frequency bands or different transmission and receiving modes pass through a region of the high-frequency circuit near the antenna terminal. With a first filter having a low blocking frequency disposed at such a position, unnecessary, lower-frequency waves can be blocked while suppressing signal loss. For instance, when the first filter circuit having a low blocking frequency is disposed in a region between the antenna terminal and the switch circuit or diplexer circuit connected thereto, through which received signals and transmitting signals pass, loss in the transmitting signals and the received signals can be suppressed.

The high-frequency circuits and high-frequency devices of the present invention will be explained in detail below referring to the attached drawings, though the present invention is not restricted thereto. Unless otherwise mentioned, explanation in an embodiment is applicable to the other embodiments.

[1] First Embodiment (A) High-frequency Circuit (1) Overall Structure

FIG. 1 shows a high-frequency circuit according to the first embodiment of the present invention commonly usable in two communications systems of a 2.4-GHz-band wireless LAN (IEEE 802.11b and/or IEEE 802.11g) and a 5-GHz-band wireless LAN (IEEE 802.11a). This high-frequency circuit comprises a switch circuit (SPDT) 101 connected to an antenna terminal Ant to be connected to a multiband antenna, a first diplexer circuit (DIP) 103 connected to the transmission path side of the switch circuit (SPDT) 101, and a high-pass filter circuit (HPF) 118 as a first filter disposed between the antenna terminal Ant and the switch circuit 101. The first diplexer circuit 103 is constituted by a lower-frequency-side filter circuit passing a transmitting signal for a 2.4-GHz-band wireless LAN but attenuating a transmitting signal for a 5-GHz-band wireless LAN, and a higher-frequency-side filter circuit passing a transmitting signal for a 5-GHz-band wireless LAN but attenuating a transmitting signal for a 2.4-GHz-band wireless LAN.

The higher-frequency-side filter circuit in the first diplexer circuit 103 is connected to a first power amplifier circuit (PA5) 105 via a lowpass filter circuit (LPF) 111. Connected to the first power amplifier circuit 105 are a first bandpass filter circuit (BPF) 107, a balanced-unbalanced circuit (BAL) 116, and first transmission terminals (transmission terminals for a 5-GHz-band wireless LAN) TX5P, TX5N in this order. With the balanced-unbalanced circuit 116, the first transmission terminals TX5P, TX5N act as balanced terminals. The bandpass filter circuit 107 removes unnecessary out-of-band noises from the transmitting signal. The first power amplifier circuit 105 amplifies a transmitting signal input from a transmission circuit for a 5-GHz-band wireless LAN. The lowpass filter circuit 111 attenuates harmonics generated from the first power amplifier circuit 105. The higher-frequency-side filter circuit in the first diplexer circuit 103 also attenuates harmonics.

Connected to the lower-frequency-side filter circuit in the first diplexer circuit 103 are a lowpass filter (LPF) 112, a second power amplifier circuit (PA2) 106, a second bandpass filter circuit (BPF) 108, and a second transmission terminal (transmission terminal for a 2.4-GHz-band wireless LAN) TX2 in this order. The bandpass filter circuit 108 removes unnecessary out-of-band noises from the transmitting signal. The second power amplifier circuit 106 amplifies a transmitting signal input from a transmission circuit for a 2.4-GHz-band wireless LAN. The lowpass filter 112 passes an amplified transmitting signal, but attenuates harmonics generated from the second power amplifier circuit 106.

Connected the receiving path side of the switch circuit 101 are a highpass filter circuit (HPF) 102 as a second filter, a low-noise amplifier circuit (LNA) 109, and a second diplexer circuit (DIP) 110 in this order. The low-noise amplifier circuit 109 desirably covers a wide frequency band to amplify received signals for 2.4-GHz-band and 5-GHz-band wireless LANs. With the low-noise amplifier circuit 109 commonly used in a 2.4-GHz band and a 5-GHz band, the miniaturization and cost reduction can be achieved without needing two low-noise amplifiers like conventional circuit structures, and the receiving sensitivity can be improved because a diplexer circuit and a bandpass circuit need not be used on the input side of the low-noise amplifier. The second diplexer circuit 110 is constituted by a lower-frequency-side filter circuit passing a received signal for a 2.4-GHz-band wireless LAN but attenuating a received signal for a 5-GHz-band wireless LAN, and a higher-frequency-side filter circuit passing a received signal for a 5-GHz-band wireless LAN but attenuating a received signal for a 2.4-GHz-band wireless LAN.

In the first and second diplexer circuits 103, 110, a combination of the lower-frequency-side filter circuit and the higher-frequency-side filter circuit is not restricted to the above one, but may be a proper combination of a lowpass filter circuit, a highpass filter, a bandpass filter and a notch filter.

A signal amplified by the low-noise amplifier 109 is branched by the second diplexer circuit 110 to a received signal for a 2.4-GHz-band wireless LAN, which is output to a second receiving terminal (receiving terminal for a 2.4-GHz-band wireless LAN) RX2 via third bandpass filter circuit (BPF) 113, and a received signal for a 5-GHz-band wireless LAN, which is output to first receiving terminals (receiving terminals for a 5-GHz-band wireless LAN) RX5P, RX5N via fourth bandpass filter circuit (BPF) 114 and a balanced-unbalanced circuit (BAL) 117. With the balanced-unbalanced circuit 117, the first receiving terminals RX5P, RX5N act as balanced terminals.

Figure 2:
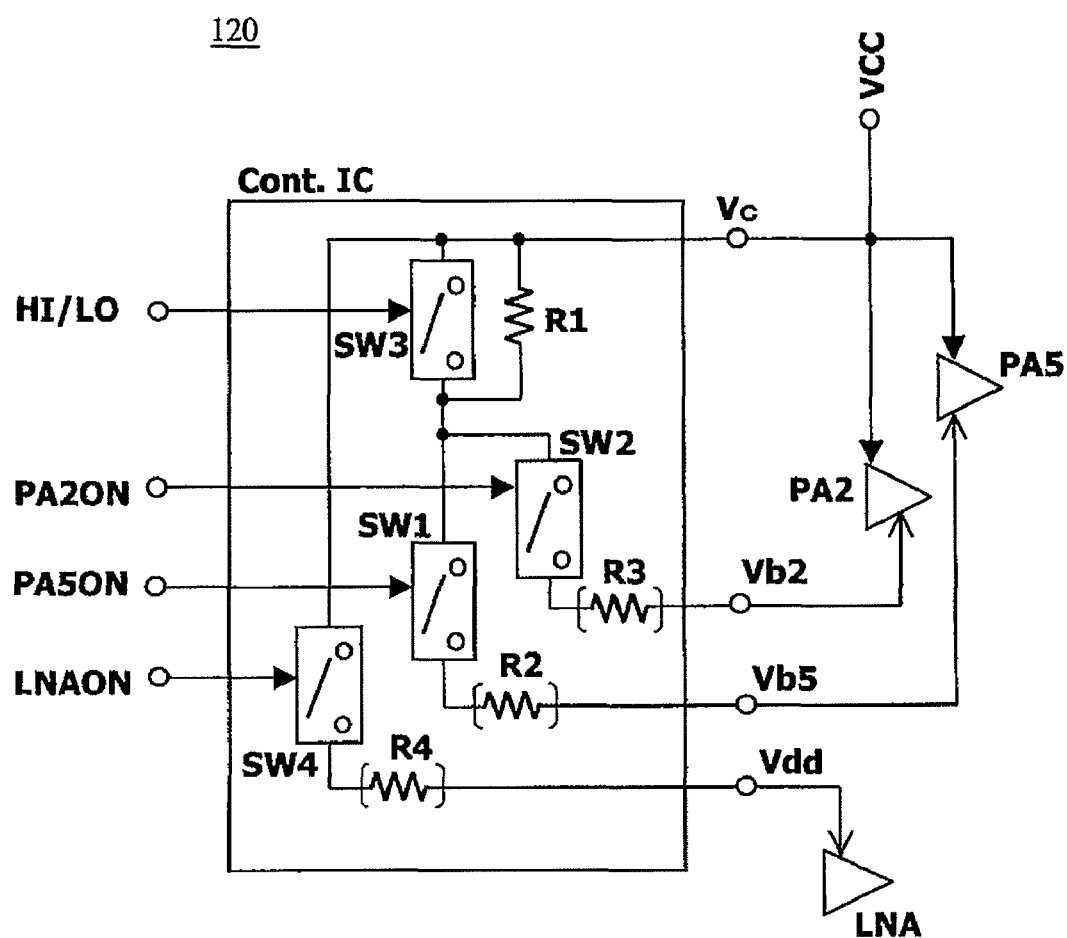
FIG. 2 is a block diagram showing one example of control circuits used in the present invention.

A voltage-applying terminal VCC applies constant voltage to first and second power amplifier circuits (PA5, PA2) 105, 106 and a control circuit (Cont. IC) 120. As shown in FIG. 2, the control circuit 120 comprises a voltage-inputting terminal Vc connected to the voltage-applying terminal VCC, a bias-voltage-outputting terminal Vb5 for the first power amplifier circuit (PA5), a bias-voltage-outputting terminal Vb2 for the second power amplifier circuit (PA2), a bias-voltage-outputting terminal Vdd for the low-noise amplifier circuit (LNA), a first switch (SW1) for turning on or off bias voltage for the first power amplifier circuit (PA5), a second switch (SW2) for turning on or off bias voltage for the second power amplifier circuit (PA2), a third switch (SW3) disposed between a common terminal of the first and second switches (SW1, SW2) and the voltage-inputting terminal Vc, a fourth switch (SW4) for turning on or off bias voltage for the low-noise amplifier circuit, a resistor R1 parallel-connected to the third switch (SW3), a terminal PA5ON for inputting a signal for the ON/OFF control of the first switch (SW1), a terminal PA2ON for inputting a signal for the ON/OFF control of the second switch (SW2), a terminal HI/LO for inputting a signal for the ON/OFF control of the third switch (SW3), and a terminal LNAON for inputting a signal for the ON/OFF control of the fourth switch (SW4).

Because the control circuit 120 need only be able to turn on or off the first to fourth switches (SW1-SW4) in a DC manner, for instance, it may be a CMOS chip in which pluralities of analog switches are integrated. The analog switches desirably have resistance of $100\Omega$ or less in an ON state. The control circuit 120 shares voltage from the voltage-applying terminal VCC with the first and second power amplifier circuits 105, 106, to supply bias voltage to the first and second power amplifier circuits 105, 106 and the low-noise amplifier circuit 109. With switches operable with signals of weak current (1 mA or less) used in the control circuit 120, low-current control can be conducted.

When the resistor R1 parallel to the third switch (SW3) has resistance of $500\Omega$ or more, the resistance of a parallel circuit of the third switch (SW3) and the resistor R1 can be as low as $100\Omega$ or less when the third switch (SW3) is in an ON state, and as high as $500\Omega$ or more in an OFF state. When a control signal from the signal-inputting terminal HI/LO turns on the third switch (SW3), a large bias voltage is applied to the power amplifier circuit. When the third switch (SW3) is turned off, a small bias voltage is applied to the power amplifier circuit. Accordingly, when a communication range is expanded, or when there is a poor communications environment, etc., the bias voltage can be made higher to increase the output of the power amplifier circuit. On the other hand, when a communication range is relatively narrow, or when there is a good communications environment, the bias voltage can be made lower to reduce current consumption.

With a resistor R2 between the first switch (SW1) and the bias-voltage-outputting terminal Vb5 for the first power amplifier circuit 105, a resistor R3 between the second switch (SW2) and the bias-voltage-outputting terminal Vb2 for the second power amplifier circuit 106, and a resistor R4 between the fourth switch (SW4) and the bias-voltage-outputting terminal Vdd for the low-noise amplifier circuit 109 having proper resistance, the bias voltages to the first and second power amplifier circuits 105, 106 and the low-noise amplifier circuit 109 can be adjusted.

Figure 3:
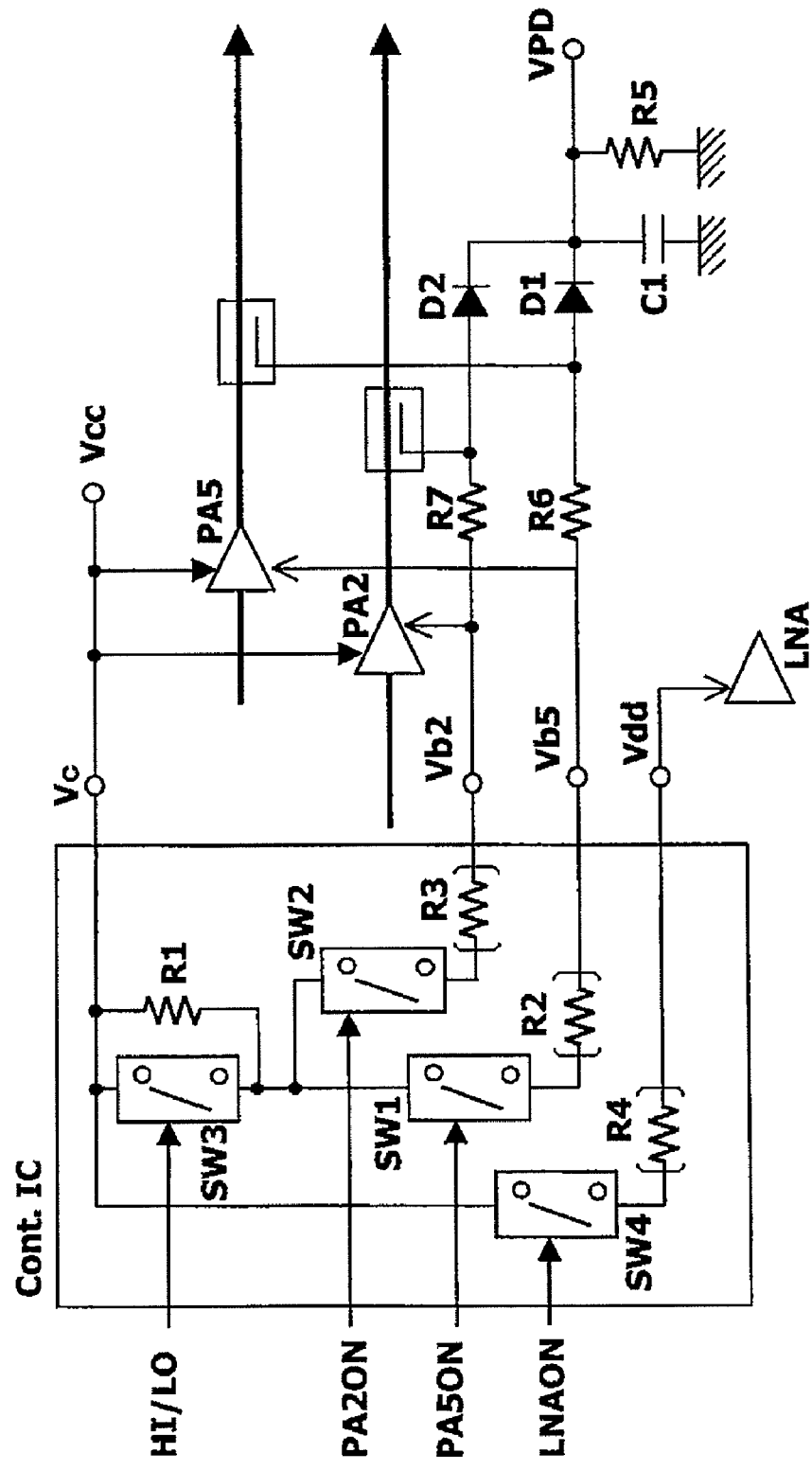
FIG. 3 is a block diagram showing one example of control circuits and detection circuits used in the present invention.

The detection outputs of detection diodes D1, D2 for the first and second power amplifier circuits PA5, PA2 are sent to a detection terminal VPD. The preferred relation between the detection diodes D1, D2 and the control circuit 120 is shown in FIG. 3. An anode of the detection diode D1 is connected to the bias-voltage-outputting terminal Vb5 of the first power amplifier circuit PA5 via resistor R6, and an anode of the detection diode D2 is connected to the bias-voltage-outputting terminal Vb2 of the second power amplifier circuit PA2 via resistor R7. Cathodes of both detection diodes D1, D2 are connected to a common detection terminal VPD via voltage-smoothing circuit comprising a capacitor C1 and a resistor R5. Sharing the detection terminal contributes to miniaturization. This structure is effective, for instance, when a high-frequency device having the high-frequency circuit of the present invention is a ceramic laminate device.

Because a usual high-frequency diode has a threshold voltage limited to about 0.1-1 V, it cannot conduct detection at small power when used for monitoring the output of a power amplifier circuit. In this embodiment, however, because bias voltage can be applied to the detection diodes D1, D2, an effective threshold voltage can be lowered, enabling detection even in a low output region. Also, because the bias voltage can be applied from a bias power supply of the power amplifier circuit to the detection diode, an additional control terminal is not needed, resulting in a simplified circuit. Because the resistors R6, R7 prevent the output of the power amplifier circuit from returning to the input of the power amplifier circuit via the detection circuit, their resistance is desirably 1 kΩ or more. Thus, the oscillation and characteristics deterioration of the power amplifier circuit can be prevented.

In a case where the RF output of the power amplifier circuit PA5 is sufficiently small in an ON state, the DC voltage of (Vb5−Vth)×[R5/(R5+R6)] is output to the detection voltage terminal VPD, when the bias voltage Vb5 to the detection diode D1 is higher than the threshold voltage Vth of the detection diode. Namely, an offset voltage is superimposed to the detection output proportional to the output of the power amplifier circuit. The same is true of the power amplifier circuit PA2. The resistors R6, R7 may be CMOS chips integrated with the control circuit 120.

The switch circuit 101 preferably comprises switching devices such as field-effect transistors (FETs) or diodes as main components, and inductance elements and capacitors, if necessary. It is, for instance, a single-pole, dual-throw (SPDT) type. TX/RX0 and TX/RX1 input to the switch circuit 101 are switching signals for the switch circuit 101.

Figure 4:
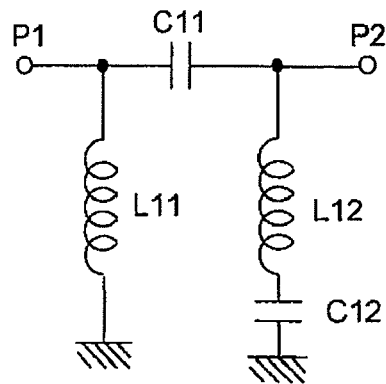
FIG. 4 is a view showing an equivalent circuit of one example of highpass filter circuits used in the present invention.
Figure 5:
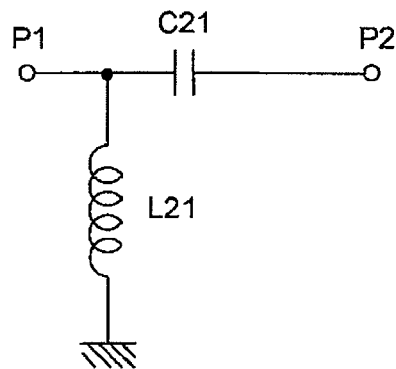
FIG. 5 is a view showing an equivalent circuit of another example of highpass filter circuits used in the present invention.

FIG. 4 shows one example of equivalent circuits of the highpass filter circuit (HPF) 118 disposed between the switch circuit 101 and the antenna terminal Ant. The highpass filter circuit 118 comprises an inductance element L11 disposed between a terminal P1 connected to the antenna terminal Ant and a ground electrode, a capacitance element C11 disposed between the terminal P1 and a terminal P2 connected to the switch circuit 101, and a series resonance circuit of an inductance element L12 and a capacitance element C12 disposed between the terminal P2 and a ground electrode. FIG. 5 shows another example of equivalent circuits of the highpass filter circuit 118. The grounded inductance element L11 has a function of preventing the breakage of the switch circuit, etc. when electrostatic discharge (ESD) is applied to the antenna. The inductance element L11 is desirably 10 nH or less.

Transmission/receiving circuits for a wireless LAN are increasingly contained in a cell phone. Signals for cell phones are mostly in a range of about 0.8-2 GHz, relatively close to a 2.4-GHz band for a wireless LAN, easily causing interference. Received interference signals are likely to saturate the low-noise amplifier circuit, failing to receive signals for the wireless LAN. To prevent interference with signals for the cell phone, the highpass filter circuit 118 attenuates a signal of 2 GHz or less. Accordingly, the highpass filter circuit 118 preferably has one or more attenuation poles between about 0.8 GHz and about 2 GHz. This function is achieved by the series resonance circuit of an inductance element L12 and a capacitance element C12.

When the desired attenuation cannot be obtained by one highpass filter circuit because the 2.4-GHz band for a wireless LAN is close to the band for a cell phone, a highpass filter circuit 102 as a second filter is preferably disposed between the switch circuit 101 and the low-noise amplifier circuit 109. In place of the circuit shown in FIG. 4, the circuit shown in FIG. 6 may be used as the highpass filter circuit 102. This highpass filter circuit comprises capacitance elements C31, C32 disposed between a terminal P3 to be connected to the switch circuit 101 and a terminal P4 to be connected to the low-noise amplifier circuit 109, and a series resonance circuit of an inductance element L31 and a capacitance element C33 disposed between a connecting point of the capacitance elements C31, C32 and a ground electrode. This highpass filter circuit also preferably has one or more attenuation poles between about 0.8 GHz and about 2 GHz.

Figure 6:
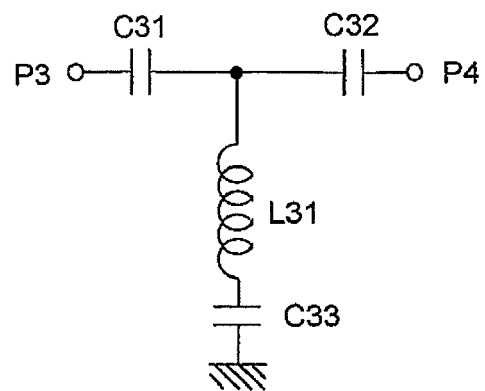
FIG. 6 is a view showing an equivalent circuit of a further example of highpass filter circuits used in the present invention.
Figure 7:
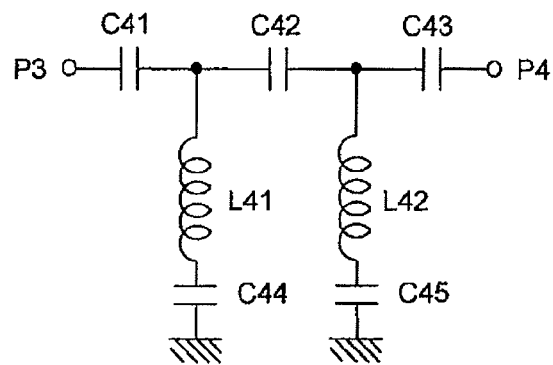
FIG. 7 is a view showing an equivalent circuit of a still further example of highpass filter circuits used in the present invention.

A multi-stage highpass filter circuit shown in FIG. 7 may also be used as the highpass filter circuit 102. This highpass filter circuit comprises capacitance elements C41-C43 disposed between a terminal P3 to be connected to the switch circuit 101 and a terminal P4 to be connected to the low-noise amplifier circuit 109, a series resonance circuit of an inductance element L41 and a capacitance element C44 disposed between a connecting point of the capacitance elements C41, C42 and a ground electrode, and a series resonance circuit of an inductance element L42 and a capacitance element C45 disposed between a connecting point of the capacitance elements C42, C43 and a ground electrode. In this highpass filter circuit, the attenuation poles of the two series resonance circuit can be set independently. When highpass filter circuits are used as the first and second filters, the second filter preferably has more stages than that of the first filter in order that the second filter has steeper filtering characteristics. Although examples of the highpass filter circuits are shown in FIGS. 6 and 7, the circuit structure may be properly modified. Although a bandpass filter circuit can be used in place of a highpass filter circuit, a highpass filter circuit is more preferable because a bandpass filter circuit has insertion loss of nearly about 2 dB, larger than the insertion loss (up to about 0.2 dB) of a highpass filter circuit. Because the highpass filter circuit can be commonly used in the first and second frequency bands, its combination with the low-noise amplifier circuit commonly used in the first and second frequency bands is suitable for miniaturization and the improvement of receiving sensitivity.

The diplexer circuits 103, 110, the lowpass filter circuits 111, 112, the bandpass filter circuits 107, 108, 113, 114, and the balanced-unbalanced circuits 116, 117 can be constituted by LC circuits comprising inductance elements and capacitance elements.

The high-frequency circuit comprising a highpass filter circuit and a low-noise amplifier circuit commonly used in communications systems having pluralities of frequency bands, and a diplexer circuit connected to the output side of the low-noise amplifier circuit for branching received signals in pluralities of frequency bands can be made small with small current consumption, and can suppress the inter-modulation distortion of the low-noise amplifier circuit by low-frequency signals from a cell phone, etc. With this circuit structure, a filter circuit in each frequency band or a variable filter circuit is not needed, making a complicated filter circuit unnecessary and suppressing current consumption.

The positions of the low-noise amplifier circuit 109 and the second diplexer circuit 110 may be exchanged. In this case, on the receiving terminal side of the second diplexer circuit 110, a low-noise amplifier circuit for amplifying a received signal in the first frequency band is disposed in a path connected to the first receiving terminal, and a low-noise amplifier circuit for amplifying a received signal in the second frequency band is disposed in a path in the second receiving terminal, and a highpass filter is disposed on the input side of the second diplexer circuit 110. In this circuit structure, the highpass filter is commonly used in the first and second frequency bands, and the low-noise amplifier circuit is disposed in each frequency band used. Accordingly, a wide-band, low-noise amplifier circuit is not needed, and a high-gain, low-noise amplifier circuit can be used.

(2) Constituent Circuits (a) Low-Noise Amplifier Circuit

Figure 8:
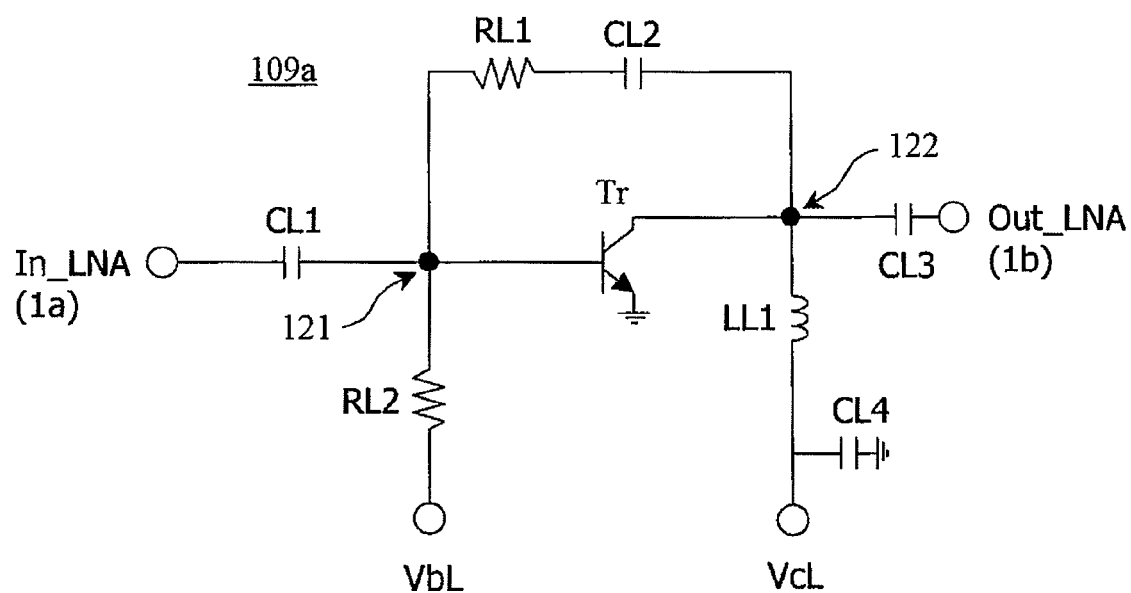
FIG. 8 is a view showing one example of low-noise amplifier circuits.
Figure 9:
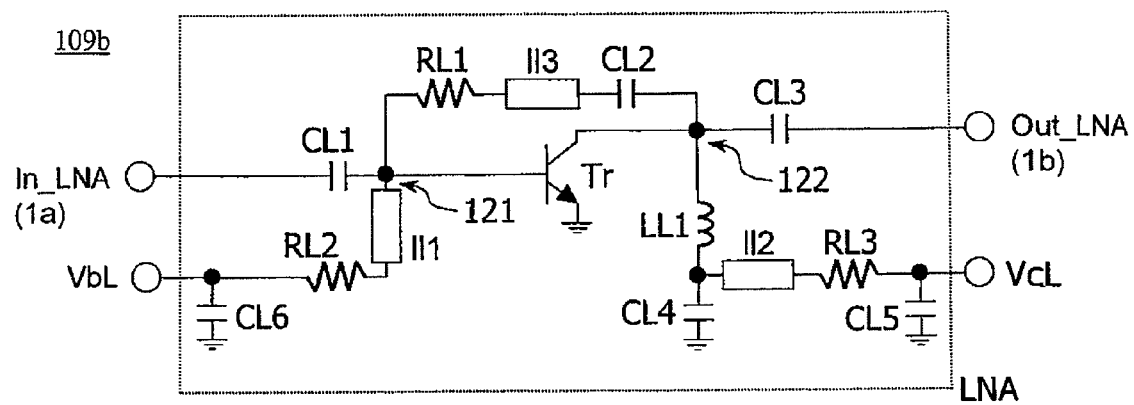
FIG. 9 is a view showing another example of low-noise amplifier circuits.

Although the low-noise amplifier circuit 109a shown in FIG. 8 can be used, a wide-band, low-noise amplifier circuit 109b shown in FIG. 9 having flat gain characteristics is preferable to amplify signals in the first and second frequency bands. The low-noise amplifier circuit 109b comprises a transistor Tr constituting an amplification circuit in the low-noise amplifier circuit LNA, an input path connected to a base of the transistor Tr, an output path connected to a collector of the transistor Tr, and a feedback circuit comprising a resistor element RL1 series-connected between a node 121 in the input path and a node 122 in the output path, an inductance element 113 and a capacitance element CL2.

Capacitance elements CL1-CL3 cut DC current, and resistor elements RL2, RL3 adjust the operating point of the low-noise amplifier circuit LNA. An inductance element LL1 acts as a choke inductor, passing DC current from a power supply VcL but preventing a high-frequency signal in the passband from leaking the power supply VcL. Although a choke inductor may be disposed in a line connected to a power supply VbL, it is not necessarily indispensable because a resistor element RL2 has as large resistance as several tens of kΩ. The resistor element RL1 feeds part of the output signal back to the input side, thereby achieving wide-band, input-output matching. Capacitance elements CL4-CL6 are noise-cutting capacitors, absorbing noises from the power supply. To avoid part of a high-frequency signal from oscillating via the power supply, the capacitance elements CL4-CL6 desirably have such impedance that they are substantially in a short-circuited state in a passband frequency. Inductance elements ll1, ll2 act as choke inductors, and the inductance element ll3 adjusts the feedback of a signal.

Figure 10:
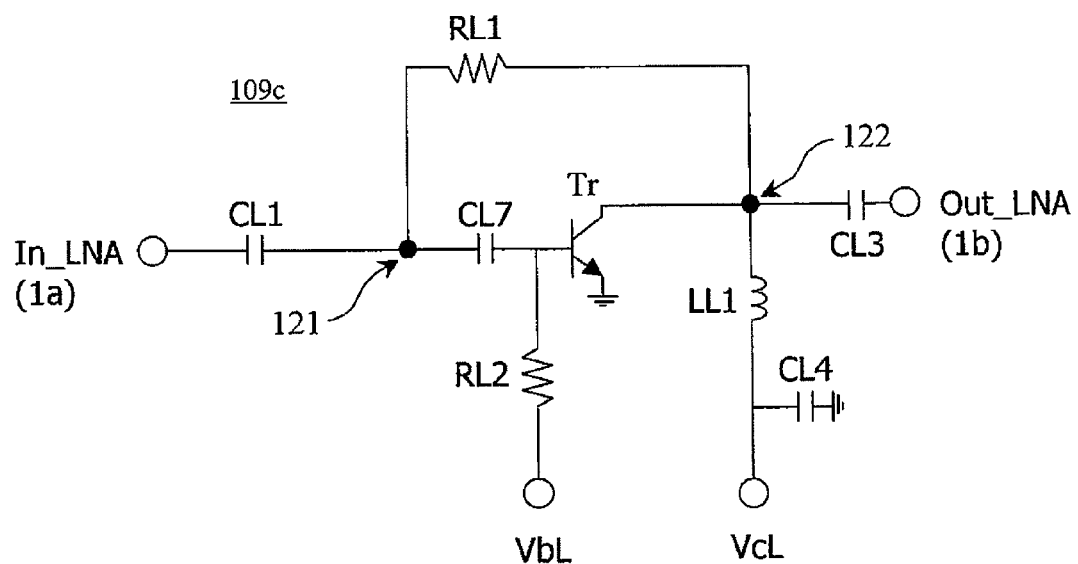
FIG. 10 is a view showing a further example of low-noise amplifier circuits.

FIG. 10 shows a further example of the low-noise amplifier circuits. This low-noise amplifier circuit 109c comprises a transistor Tr, an input path connected to a base of the transistor Tr, an output path connected to a collector of the transistor Tr, a feedback circuit comprising a resistor RL1 between a node 121 in the input path and a node 122 in the output path, and a capacitor CL7 disposed between the node 121 in the input path and the base of the transistor Tr. With the capacitor CL7 connected between the node 121 and the base of the transistor Tr, the gain characteristics are flattened. Because the capacitor CL7 having appropriate capacitance has high impedance at low frequencies and low impedance at high frequencies, it can lower the frequency dependency of a low-noise amplifier circuit gain, thereby reducing the gain difference between frequencies of, for instance, 2.4 GHz and 5.85 GHz to 2 dB or less. The gain is 2 dB or less even at 2-6 GHz. Also, the gain of 12 dB or more is obtained in a frequency range of 2.4-5.85 GHz. Such structure is suitable for the amplification of a received signal in a multiband communications system, and when the gain difference among two or more frequency bands is 5 dB or less, particularly 4 dB or less, a high-frequency circuit having an excellent receiving circuit for multiband communications [for instance, two communications systems comprising a 2.4-GHz-band wireless LAN (IEEE 802.11b and/or IEEE 802.11g) and a 5-GHz-band wireless LAN (IEEE 802.11a and/or IEEE 802.11h)] can be obtained.

The capacitance of the capacitor CL7 is preferably smaller than that of the DC-cutting capacitor CL1, such that the DC-cutting capacitor CL1 is regarded as being short-circuited in a frequency band used, while the capacitor CL7 functions effectively. Because the amount of feedback is determined only by the resistor RL1 in the low-noise amplifier circuit 109c shown in FIG. 10, the capacitor CL7 need not have large capacitance, and when its capacitance is as low as about 2 pF, for instance, in a 2.4-GHz band, it can be used as part of the matching circuit. The capacitor CL7 having small capacitance can reduce the time necessary for rising a signal by the ON-OFF control of a base voltage of a transistor. A signal rise time by the ON/OFF control of a base voltage of a transistor is 0.8 μsec. in the low-noise amplifier circuit 109a in which the capacitor CL2 is 15 pF, while it is 0.1 μsec. in the low-noise amplifier circuit 109c in which CL7 is 2 pF.

Figure 11:
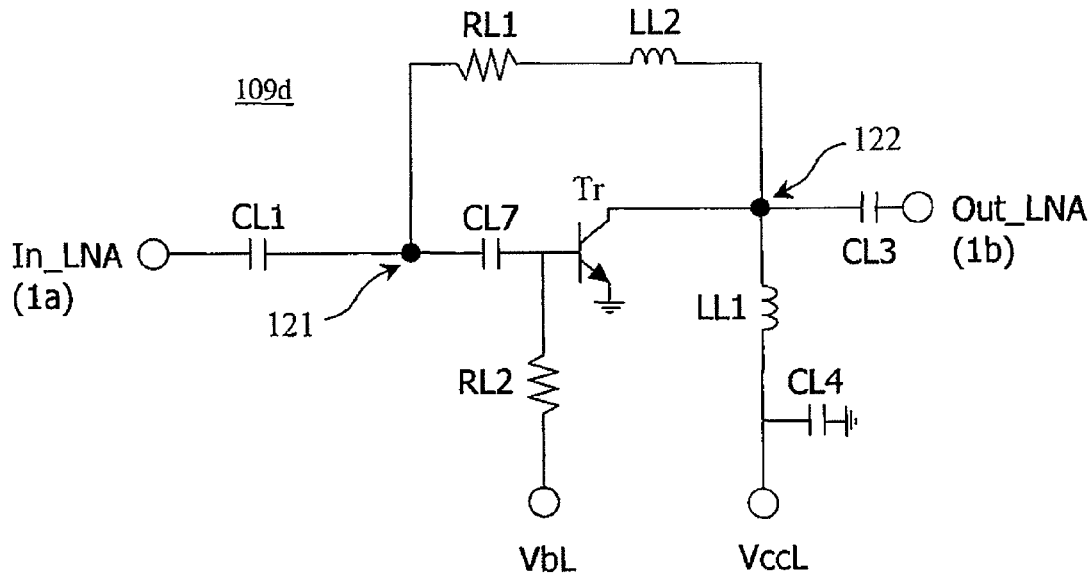
FIG. 11 is a view showing a still further example of low-noise amplifier circuits.

FIG. 11 shows a further example of low-noise amplifier circuits. In this low-noise amplifier circuit 109d, an inductance element LL2 is connected in series to the resistor RL1 in the feedback circuit. Because the inductance element LL2 has large impedance at high frequencies, the amount of feedback is smaller at high frequencies than at low frequencies, resulting in higher gain at high frequencies, and further flattening the frequency dependency of gain. As a result, the gain difference between frequencies of 2.4 GHz and 5.85 GHz can be 1 dB or less, and the gain width can be 1 dB or less even at 2-6 GHz. The gain of 13 dB or more can be obtained in a used frequency range of 2.4-5.85 GHz. To improve the gain and flatten its frequency dependency, the inductance element LL2 desirably has a higher self-resonance frequency than the passband, and has a Q value of 10 or more in the passband. Using this low-noise amplifier circuit, the gain difference of the low-noise amplifier circuit in various frequency bands can be suppressed to, for instance, 4 dB or less.

Figure 12:
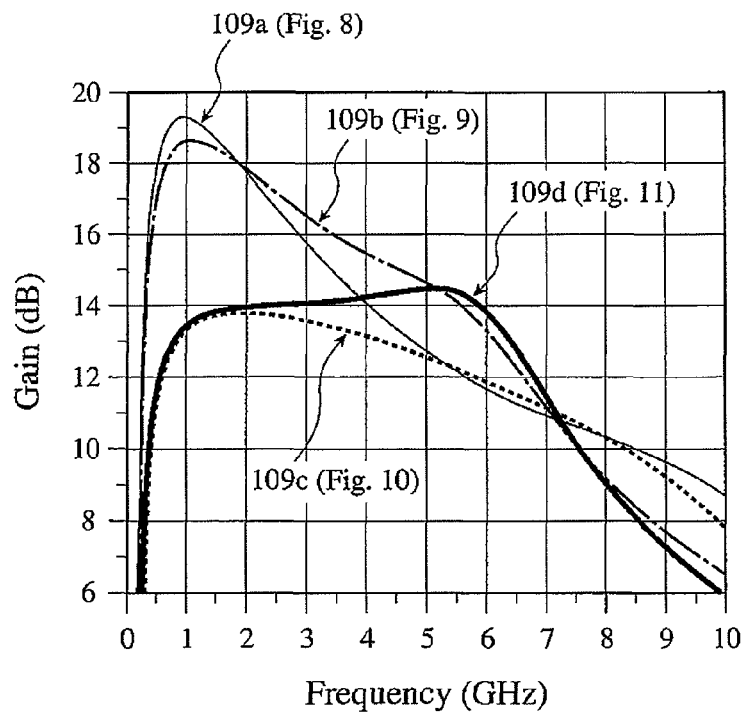
FIG. 12 is a graph showing the gain characteristics of a low-noise amplifier circuit.

FIG. 12 shows the gain characteristics of low-noise amplifier circuits 109a to 109d (FIGS. 8-11) having various feedback circuits. It has been found that the low-noise amplifier circuit 109b having an inductance element 113 in the feedback circuit has a wide-banded-gain with suppressed peak. The gain difference at frequencies of 2.4 GHz and 5.85 GHz, 2 GHz or more different from each other, is 5.1 dB in the low-noise amplifier circuit 109a, while it is 4 dB or less in the low-noise amplifier circuit 109b. The gain width between 2 GHz and 6 GHz is 6 dB in the low-noise amplifier circuit 109a, while it is 5 dB or less in the low-noise amplifier circuit 109b. Also, the low-noise amplifier circuit 109b has gain of 13 dB or more in the used frequency band of 2.4-5.85 GHz. The low-noise amplifier circuits 109c and 109d have further flattened gain characteristics.

(b) Bypass Circuit

Figure 13:
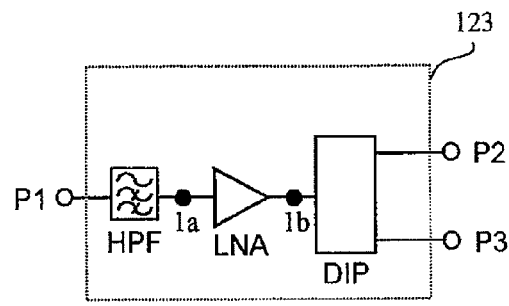
FIG. 13 is a block diagram showing one example of high-frequency sub-circuits.
Figure 14A:
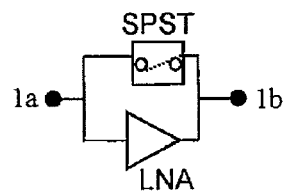
FIG. 14(a) is a block diagram showing one example of low-noise amplifier means in the high-frequency sub-circuit.
Figure 15:
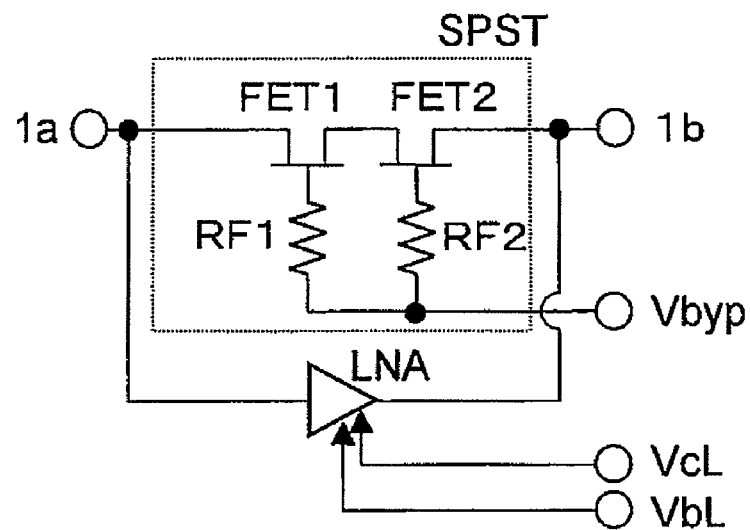
FIG. 15 is a view showing one example of equivalent circuits of bypass switch means in the low-noise amplifier means shown in FIG. 13.

To prevent a strong received signal sent from the antenna from being distorted in the low-noise amplifier circuit LNA, a high-frequency sub-circuit 123 shown in FIG. 13 is preferably disposed. In one example of the high-frequency circuits 123, a single-pole, single-throw (SPST)-type bypass switch is connected in parallel to the low-noise amplifier circuit LNA as shown in FIG. 14(a). The SPST switch may be a circuit comprising series-connected field-effect transistors FET1, FET2 as shown in FIG. 15. A PIN diode may substitute for the field-effect transistor. When the received signal is strong, the low-noise amplifier circuit LNA is put in an unoperated state by placing the bypass switch SPST in an ON state, for instance, with 3 V applied from a power supply terminal Vbyp and with 0 V applied from a power supply terminal VbL. Because the unoperated low-noise amplifier circuit LNA has high isolation, the received signal reaches the diplexer circuit DIP through the bypass switch SPST. Even when such a strong received signal as to saturate the low-noise amplifier circuit LNA is input, the received signal passes not through the low-noise amplifier circuit LNA but through the bypass switch SPST, its distortion is prevented. When the received signal is weak, for instance, 0 V is applied from the power supply terminal Vbyp to place the bypass switch SPST in an OFF state, and 3 V is applied from the power supply terminal VbL, so that the low-noise amplifier circuit LNA is operated. Because the bypass switch SPST in an OFF state has high isolation, the received signal reaches the diplexer circuit DIP through the low-noise amplifier circuit LNA. In this case, because the low-noise amplifier circuit LNA is operated, the received signal is amplified, improving receiving sensitivity.

Figure 16:
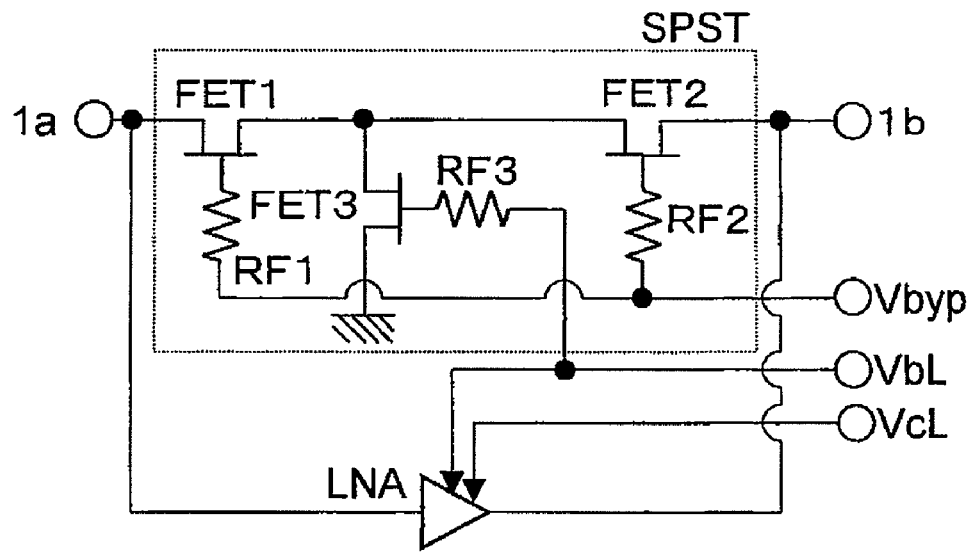
FIG. 16 is a view showing another example of equivalent circuits of a bypass switch means in the low-noise amplifier means shown in FIG. 13.

When the bypass switch SPST in an OFF state has insufficient isolation, a grounded field-effect transistor FET3 is preferably connected between the field-effect transistors FET1 and FET2 as shown in FIG. 16.

Figure 14B:
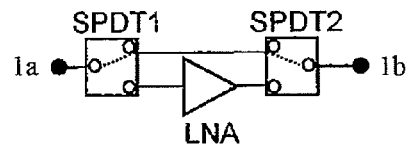
FIG. 14(b) is a block diagram showing another example of low-noise amplifier means in the high-frequency sub-circuit.
Figure 17:
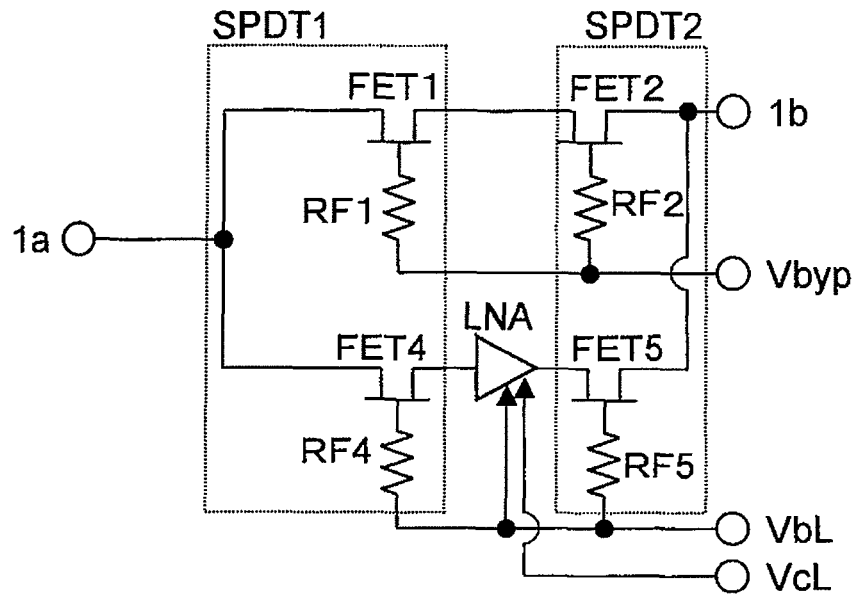
FIG. 17 is a view showing a further example of equivalent circuits of a bypass switch means in the low-noise amplifier means shown in FIG. 14(a).
Figure 18:
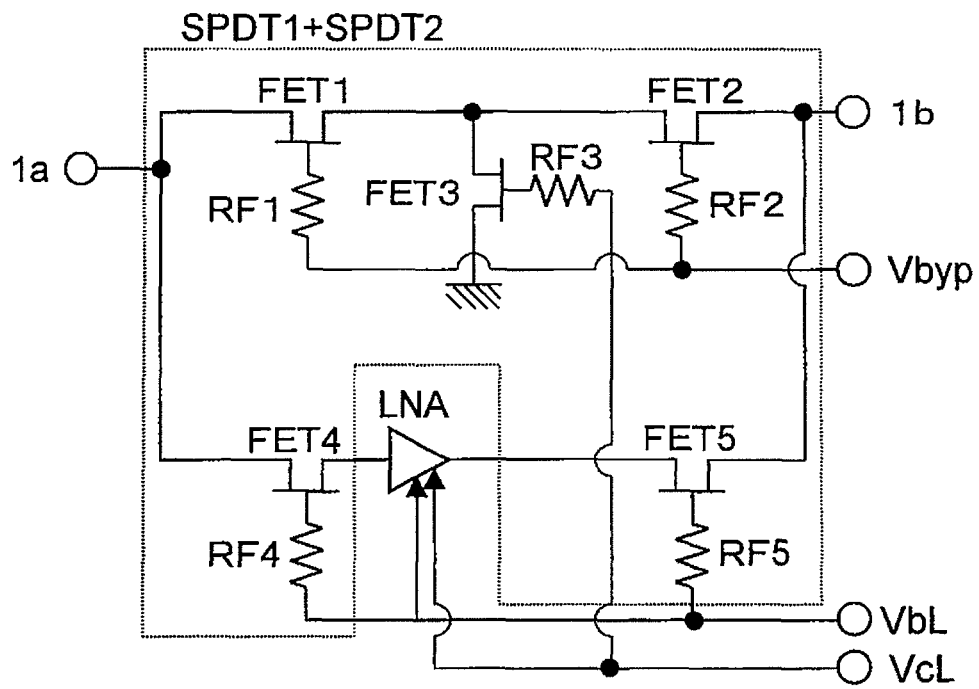
FIG. 18 is a view showing a still further example of equivalent circuits of a bypass switch means in the low-noise amplifier means shown in FIG. 14(a).

When the low-noise amplifier circuit LNA has insufficient isolation in an unoperated state, a bypass switch comprising two single-pole, double-throw (SPDT)-type switches may be used as shown in FIG. 14(b). As shown in FIG. 17, the bypass switch having a combination of SPDT switches preferably comprises series-connected field-effect transistors FET 1, FET2 in the bypass, and a field-effect transistor FET4 between the terminal 1a and the low-noise amplifier circuit LNA. If necessary, a field-effect transistor FET5 may be added between the low-noise amplifier circuit LNA and the terminal 1b. A PIN diode may substitute for the field-effect transistor. In this case, too, when the bypass has insufficient isolation, a grounded field-effect transistor FET3 is preferably connected between the field-effect transistors FET1 and FET2 as shown in FIG. 18.

Figure 14C:
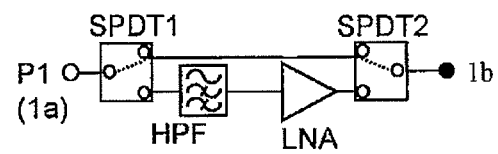
FIG. 14(c) is a block diagram showing a further example of low-noise amplifier means in the high-frequency sub-circuit.
Figure 14D:
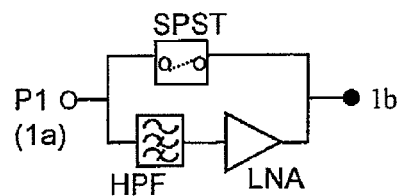
FIG. 14(d) is a block diagram showing a still further example of low-noise amplifier means in the high-frequency sub-circuit.

To further reduce the distortion of the received signal, a highpass filter circuit is preferably disposed between a branching point of the bypass and the low-noise amplifier circuit LNA, and the low-noise amplifier circuit LNA. In the example shown in FIG. 14(c), a highpass filter circuit HPF is disposed between the bypass switch SPDT1 on the antenna side and the low-noise amplifier circuit LNA. In this case, SPDT1 corresponds to the above branching point, and SPDT2 corresponds to a connecting point of the bypass and the low-noise amplifier circuit LNA. This circuit structure can reduce the insertion loss of the bypass, so that the bypass can handle even a small received signal. As a result, a received signal can be made small when the low-noise amplifier circuit LNA is operated, resulting in small distortion of the received signal. For instance, in a case where the minimum strength of a received signal at the bypass-side terminal of the bypass switch SPDT1 for using the bypass is −10 dBm, where the insertion loss of the highpass filter 124 is 1 dB, and where the insertion loss of the bypass switch SPDT1 is 0.5 dB, the minimum strength of a received signal is −8.5 dBm at the terminal 1a and −10 dBm at the input of the low-noise amplifier circuit LNA, in the circuit enabling the use of the bypass, which is shown in FIG. 14(b). On the other hand, in the circuit enabling the use of the bypass, which is shown in FIG. 14(c), the minimum strength of received signal is −9.5 dBm at the terminal P1, and −11 dBm at the input of the low-noise amplifier circuit LNA. The comparison of the circuits shown in FIGS. 14(b) and 14(c) indicates that because the minimum received signal in the bypass can be reduced correspondingly to the insertion loss of the highpass filter 124, the receiving sensitivity can be improved. In place of the bypass switches SPDT1 and SPDT2 shown in FIG. 14(c), the SPST-type switch shown in FIG. 14(d) may be disposed in the bypass.

Figure 19:
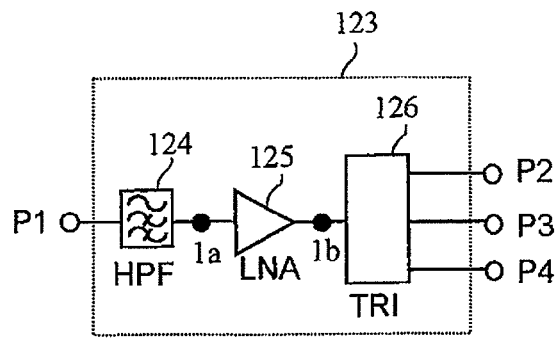
FIG. 19 is a block diagram showing another example of high-frequency sub-circuits.

The high-frequency sub-circuit 123 shown in FIG. 19 comprises a highpass filter circuit HPF having a passband of 2.4-5 GHz, a low-noise amplifier circuit 125 for amplifying a received signal passing through the highpass filter circuit HPF, and a triplexer circuit TRI for branching received signals to a 2.4-GHz band, a 3.5-GHz band and a 5-GHz band.

The terminal P1 is connected to an antenna-side circuit, the terminal P2 is connected to a 5-GHz-band receiving circuit, the terminal P3 is connected to a 2.4-GHz-band receiving circuit, and the terminal P4 is connected to a 3.5-GHz-band receiving circuit. IEEE 802.16 (WiMAX) and its derivatives are used in a 3.5-GHz band.

The high-frequency sub-circuit 123 in the high-frequency circuit of the present invention comprises a highpass filter circuit whose passband is a receiving frequency band, a low-noise amplifier means comprising a low-noise amplifier circuit connected to the highpass filter circuit for amplifying received signals passing through the highpass filter circuit, and a branching circuit connected to the output side of the low-noise amplifier means for branching received signals in pluralities of frequency bands, the highpass filter circuit and the low-noise amplifier means being commonly used in communications systems having pluralities of frequency bands.

Figure 20:
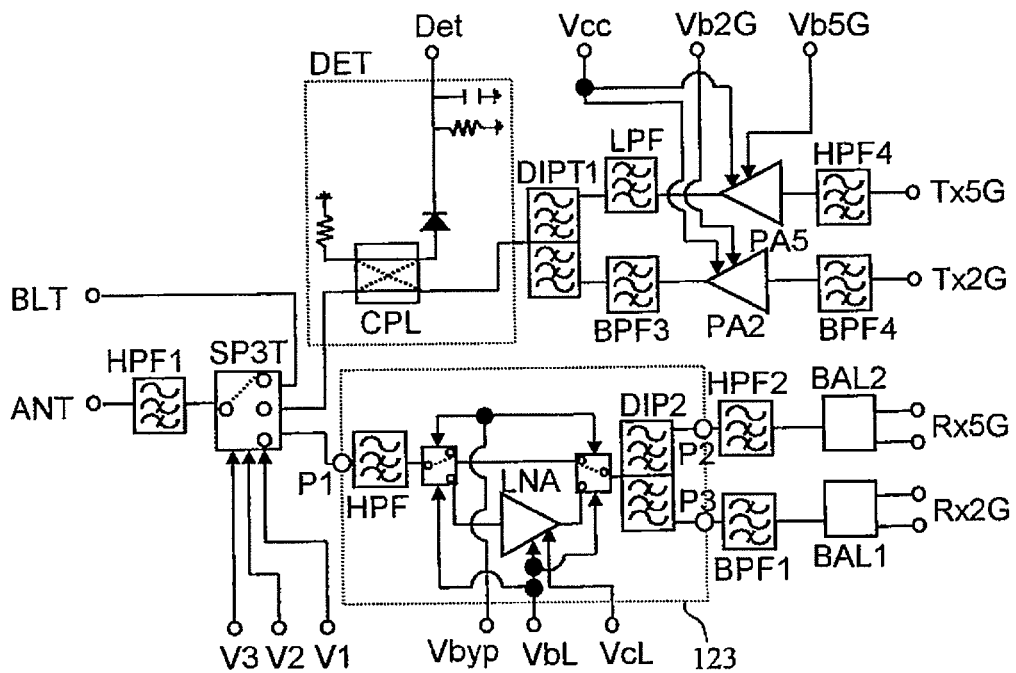
FIG. 20 is a block diagram showing one example of high-frequency switch circuits comprising the high-frequency circuit.

FIG. 20 shows an example of high-frequency switch circuits commonly usable in two communications systems of a 2.4-GHz-band wireless LAN and a 5-GHz-band wireless LAN, which has a high-frequency sub-circuit 123. This high-frequency switch circuit comprises transmission paths between an antenna terminal Ant and transmission terminals (Tx2G, Tx5G), receiving paths between the antenna terminal Ant and receiving terminals (Rx2G, Rx5G), a Bluetooth path between the antenna terminal Ant and a transmission/receiving terminal (BLT) for Bluetooth, a switch circuit SP3T for switching these paths, and a high-frequency sub-circuit 123 disposed in a path between the switch circuit SP3T and the receiving terminals (Rx2G, Rx5G). The antenna terminal Ant to be connected to a multiband antenna is connected to the highpass filter HPF1, which is connected to the downstream switch circuit SP3T. The highpass filter HPF1 attenuates frequencies of about 1 GHz or less, preventing semiconductor devices such as a switch circuit, etc. from being destroyed when electrostatic discharge is applied to the antenna. The switch circuit SP3T switches the connections of the antenna to the transmission terminals, the receiving terminals and the transmission/receiving terminal for Bluetooth. When the transmission/receiving terminal for Bluetooth is not needed, a SPDT-type switch circuit may be used in place of the switch circuit SP3T.

A transmission terminal of the switch circuit SP3T is connected to a detection circuit DET, which is connected to a first diplexer circuit DIPT1. The detection circuit DET comprises a directional coupler CPL, a terminal resistor connected to one end of a sub-line in the directional coupler CPL, a Schottky diode connected to the other end of the sub-line, and a smoothing circuit connected to the Schottky diode and comprising a resistor element and a capacitance element. A main line in the directional coupler CPL is connected to the switch circuit SP3T and the first diplexer circuit DIPT1. The detection circuit DET outputs DC voltage corresponding to a transmitting signal current from a detection output terminal Det. The detection circuit DET may be disposed between the first diplexer circuit DIPT1 and each power amplifier circuit PA2, PA5, though such arrangement is not suitable for miniaturization because it needs two detection circuits. The detection circuit DET may be disposed in each power amplifier circuit PA2, PA5. The DC voltage output from the detection output terminal Det of the detection circuit DET is fed back via an RFIC circuit, etc., and utilized for the control of the power amplifier circuits PA2, PA5.

Connected to the lower-frequency-side filter circuit of the first diplexer circuit DIPT1 are a bandpass filter BPF3, a high-frequency amplification circuit PA2, a bandpass filter BPF4, and a transmission terminal Tx2G for a 2.4-GHz-band wireless LAN in this order. When the transmission terminal Tx2G should provide a balanced output, a balanced-unbalanced converter circuit is added. The bandpass filter circuit BPF4 removes unnecessary out-of-band noises from the transmitting signal. The high-frequency amplification circuit PA2 amplifies a transmitting signal input from a transmission circuit of a 2.4-GHz-band wireless LAN. The bandpass filter BPF3 passes a transmitting signal amplified by the high-frequency amplification circuit PA2 while removing noise and harmonics generated from the high-frequency amplification circuit PA2. The lower-frequency-side filter circuit of the first diplexer circuit DIPT1 also attenuates harmonics generated from the high-frequency amplification circuit PA2. The bandpass filter circuits BPF3, BPF4 may be omitted depending on the desired characteristics, or changed to lowpass filter circuits, highpass filter circuits, or notch filter circuits.

Connected to the higher-frequency-side filter circuit of the first diplexer circuit DIPT1 are a lowpass filter circuit LPF, a high-frequency amplification circuit PA5, a highpass filter circuit UPF4, and a transmission terminal Tx5G for a 5-GHz-band wireless LAN in this order. When the transmission terminal Tx5G should provide a balanced output, a balanced-unbalanced converter circuit is added. The highpass filter circuit BPF4 removes lower-frequency, unnecessary, out-of-band noises from the transmitting signal. The high-frequency amplification circuit PA5 amplifies a transmitting signal input from a transmission circuit for a 5-GHz-band wireless LAN. The lowpass filter circuit LPF passes a transmitting signal amplified by the high-frequency amplification circuit PA5 while attenuating harmonics generated from the high-frequency amplification circuit PA5. The highpass filter circuit HPF4 and the lowpass filter circuit LPF may be omitted depending on the desired characteristics, or changed to bandpass filter circuits or notch filter circuits.

The receiving terminal of the switch circuit SP3T is connected to the high-frequency sub-circuit 123. The high-frequency sub-circuit 123 comprises a highpass filter circuit HPF whose passband is a frequency band for a wireless LAN of a 2.4-GHz band and a 5-GHz band, a low-noise amplifier circuit LNA for amplifying a received signal for a wireless LAN of a 2.4-GHz band and a 5-GHz band, a bypass switch for preventing the distortion of the low-noise amplifier circuit LNA when a strong received signal is input, and a diplexer circuit DIP2 for branching received signals to a 2.4-GHz band and a 5-GHz band. The details of the high-frequency sub-circuit 123 will be omitted because they have already been explained.

Connected to the terminal P3 of the high-frequency sub-circuit 123 are a bandpass filter circuit BPF1, a balanced-unbalanced converter circuit BAL1, and a receiving terminal Rx2G for a 2.4-GHz-band wireless LAN in this order. The bandpass filter circuit BPF1 removes unnecessary out-of-band noises from a received signal for a 2.4-GHz-band wireless LAN sent from the antenna. To improve the noise resistance of a receiving circuit for a 2.4-GHz-band wireless LAN, the balanced-unbalanced converter circuit BAL1 balances the circuit. Signals having equal amplitudes with 180° phase difference are ideally output from the two balanced receiving terminals for a 2.4-GHz-band wireless LAN. The balanced-unbalanced converter circuit BAL1 may have an impedance-converting function. The bandpass filter circuit BPF1 may be omitted depending on the desired characteristics, or changed to a highpass filter circuit or a notch filter circuit.

Connected to the terminal P2 of the high-frequency sub-circuit 123 are a highpass filter circuit HPF2, a balanced-unbalanced converter circuit BAL2, and a receiving terminal Rx5G for a 5-GHz-band wireless LAN in this order. The highpass filter circuit HPF2 removes lower-frequency, out-of-band, unnecessary noise from a received signal for a 5-GHz-band wireless LAN sent from the antenna. To improve the noise resistance of a receiving circuit for a 5-GHz-band wireless LAN, the balanced-unbalanced converter circuit BAL2 balances the circuit. Signals having equal amplitudes with 180° phase difference are ideally output from the two balanced receiving terminals for a 5-GHz-band wireless LAN. The balanced-unbalanced converter circuit BAL2 may have an impedance-converting function. The highpass filter circuit HPF2 may be omitted depending on the desired characteristics, or changed to a bandpass filter circuit or a notch filter circuit.

The diplexer circuits DIP2, DIPT1, the lowpass filter circuit LPF, the bandpass filter circuits BPF1, BPF3, BPF4, the highpass filter circuits HPF, HPF1, HPF2, HPF4, the balanced-unbalanced circuit BAL1, BAL2, and the directional coupler CPL may be constituted by LC circuits in which inductance elements and capacitance elements are combined.

The structure of the bypass is applicable not only to high-frequency circuits for multiband wireless apparatuses, but also to those for single-band wireless apparatuses.

(B) High-frequency Device

Figure 21:
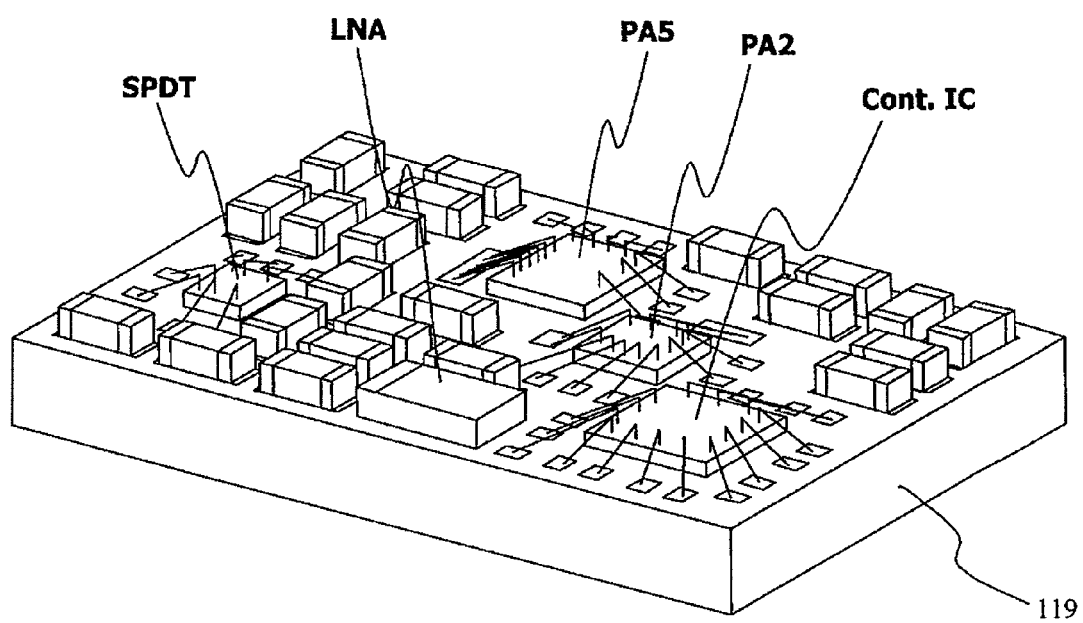
FIG. 21 is a perspective view showing a high-frequency device according to the first embodiment of the present invention.

The high-frequency device having the high-frequency circuit of the present invention can be a ceramic laminate device. FIG. 21 shows a high-frequency device according to one embodiment of the present invention.

The ceramic laminate device 119 can be produced, for instance, by printing a conductor paste of Ag, Cu, etc. having low resistivity on each green sheet having a thickness of 10-200 μm, which is made of dielectric ceramic materials sinterable at as low temperatures as 1000° C. or lower (LTCC; low-temperature co-fired ceramics), to form predetermined electrode patterns, integrally laminating pluralities of green sheets provided with electrode patterns, and sintering them.

The dielectric ceramic materials may be, for instance, (a) ceramics comprising Al, Si and Sr as main components, and Ti, Bi, Cu, Mn, Na, K, etc. as sub-components, (b) ceramics comprising Al, Si and Sr as main components, and Ca, Pb, Na, K, etc. as sub-components, (c) ceramics comprising Al, Mg, Si and Gd, (d) ceramics comprising Al, Si, Zr and Mg, etc. The dielectric ceramic materials preferably have dielectric constants of about 5-15. In addition to the dielectric ceramic materials, resins or composites of resins with ceramic powder may be used. Using $Al_2O_3$-based high-temperature-cofired ceramics (HTCC) for a ceramic substrate, transmission lines, etc. may be formed by high-temperature-sinterable metals such as tungsten, molybdenum, etc.

Each layer in the ceramic laminate device 119 is provided with pattern electrodes for inductance elements, capacitance elements, wiring lines and ground electrodes, and the pattern electrodes are connected by via-hole electrodes. Those constituted by LC circuits are mainly formed by the pattern electrodes. Specifically, main circuit portions of the highpass filter circuits 118, 102, the first and second diplexer circuits 103, 110, the lowpass filter circuits 111, 112, the bandpass filter circuits 107, 108, 113, 114, and the balanced-unbalanced circuits 116, 117 are formed in a multilayer ceramic substrate 119, and part of their elements are mounted as chip devices on a top surface of the multilayer ceramic substrate 119. Also, part of elements for the switch circuit 101, the first and second power amplifier circuits 105, 106, the low-noise amplifier circuit 109 and the control circuit 120 are contained in the ceramic laminate device 119.

Mounted on a top surface of the ceramic laminate device 119 are semiconductor devices for the switch circuit (SPDT) 101, the first and second power amplifier circuits (PA5) 105, (PA2) 106, the low-noise amplifier circuit (LNA) 109 and the control circuit (Cont. IC) 120. Chip capacitors, chip resistors, chip inductors, etc. are also mounted. These devices are connected by a wire bonder, LGA, BGA, etc. Particularly with semiconductor devices for the control circuit mounted on the top surface of the ceramic laminate device 119, the high-frequency circuit can be formed by a small high-frequency device. The elements contained in the ceramic laminate device 119 and the devices mounted thereon are connected to provide the circuit shown in FIG. 1.

Figure 22:
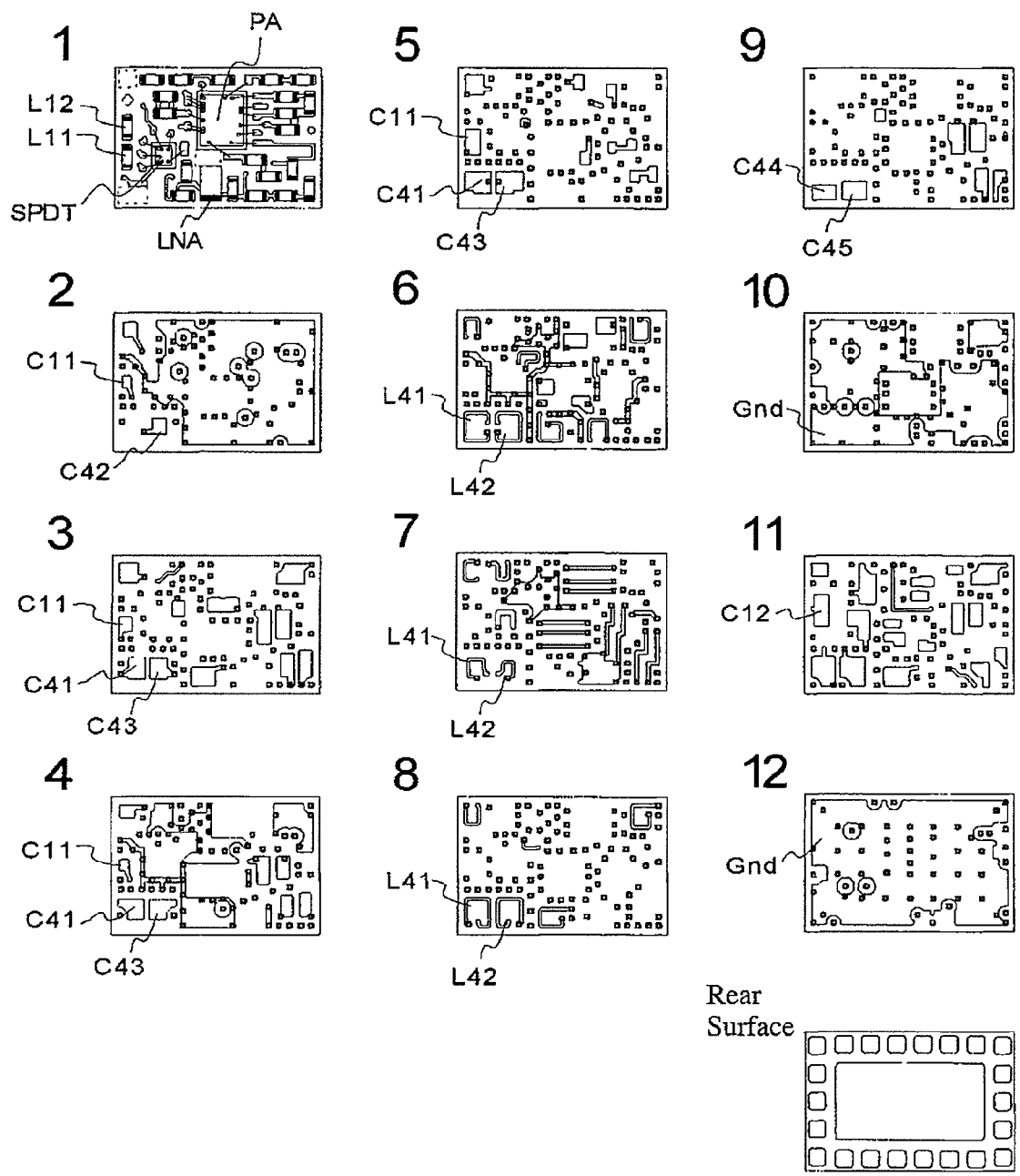
FIG. 22 is a development view showing a ceramic laminate device for the high-frequency device according to the first embodiment of the present invention.

FIG. 22 shows each layer constituting a high-frequency device having the high-frequency circuit shown in FIG. 1. The first filter circuit is constituted by the highpass filter circuit (first highpass filter) shown in FIG. 4, and the second filter is constituted by the highpass filter circuit (second highpass filter) shown in FIG. 7. The grounded inductance elements L11, L12 in the first highpass filter disposed between the antenna terminal Ant and the switch circuit SPDT are mounted as chip inductors on a surface layer 1. Using chip devices as the inductance elements needing high inductance, the overall high-frequency device can be miniaturized. The grounded inductance elements L41, L42 in the second highpass filter disposed between the switch circuit SPDT and the low-noise amplifier circuit LNA are formed by conductor patterns in the ceramic laminate device 119. A conductor pattern constituting the capacitance element C11 disposed in series in an input/output line of the highpass filter circuit between the terminals P1 and P2 is formed on the second to fifth layers below the inductance elements L11, L12, and shielded from the surrounding circuits by lines of via-electrodes connected to a ground electrode Gnd. Conductor patterns for the capacitance element C11 are formed on pluralities of layers to reduce parasitic capacitance.

Conductor patterns constituting the capacitance element C12 disposed between the inductance element L12 and the ground are formed on the 11th layer, and connected to the inductance element L12 on the surface layer 1 via via-electrodes. Conductor patterns for the capacitance element C12 are opposing a ground electrode Gnd on the 10th layer and a ground electrode Gnd on the 12th layer, and sandwiched by them. The second highpass filter circuit between the terminals P3 and P4 is disposed in a corner region of the laminate when viewed from above, and surrounded by the sides of the laminate and lines of via-electrodes connected to ground electrodes. With such structure, capacitance elements C41-C43 disposed in series in the input/output line of the second highpass filter circuit, a series resonance circuit comprising an inductance element L41 and a capacitance element C44, and a series resonance circuit comprising an inductance element L42 and a capacitance element C45 are shielded from the first highpass filter and other circuits. Of course, this shield structure can be changed depending on the desired characteristics, or may be omitted. Conductor patterns for constituting the inductance elements L41, L42 are formed on the sixth to eighth layers, such that they are winding in a lamination direction. Conductor patterns for constituting the inductance elements L41, L42 are formed on layers adjacent in a lamination direction such that they are not overlapping except for via-electrodes. Such structure reduces parasitic capacitance and the Q values of inductance elements, thereby suppressing self-resonance.

[2] Second Embodiment (A) High-frequency Circuit

Figure 23:
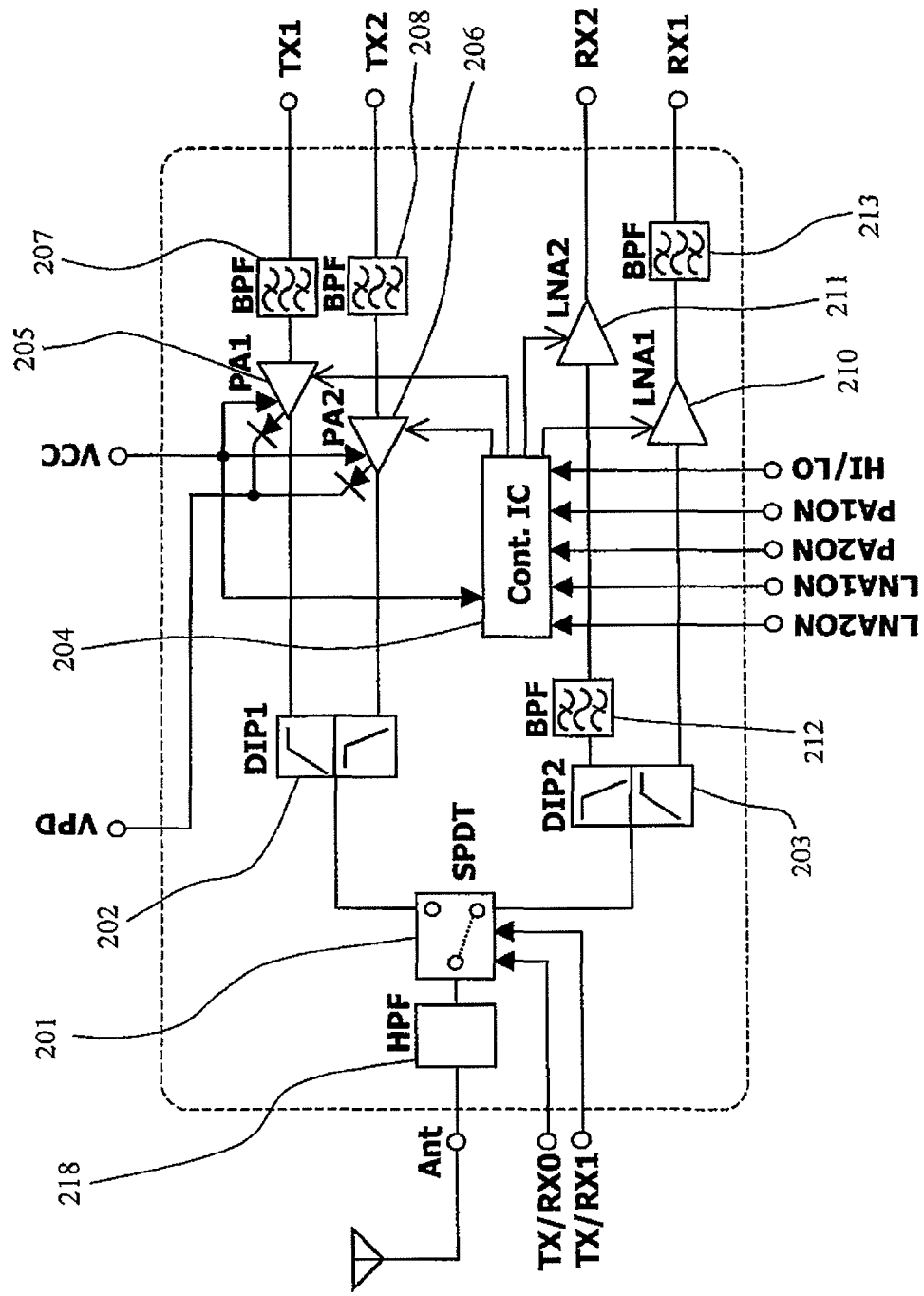
FIG. 23 is a block diagram showing one example of high-frequency circuits according to the second embodiment of the present invention.

FIG. 23 shows a high-frequency circuit according to the second embodiment of the present invention commonly usable in two communications systems of a 5-GHz-band wireless LAN (IEEE 802.11a) and a 2.4-GHz-band wireless LAN (IEEE 802.11b and/or IEEE 802.11g). This high-frequency circuit comprises a switch circuit (SPDT) 201 connected to an antenna terminal Ant to be connected to a multi-band antenna, and a first diplexer circuit (DIP1) 202 connected to the transmission path side of the switch circuit (SPDT) 201. A highpass filter circuit (HPF) 218 is disposed as the first filter between the antenna terminal Ant and the switch circuit 201.

The first diplexer circuit 202 comprises a lower-frequency-side filter circuit passing a transmitting signal for a 2.4-GHz-band wireless LAN but attenuating a transmitting signal for a 5-GHz-band wireless LAN, and a higher-frequency-side filter circuit passing a transmitting signal for a 5-GHz-band wireless LAN but attenuating a transmitting signal for a 2.4-GHz-band wireless LAN. Connected to the higher-frequency-side filter circuit of the first diplexer circuit 202 are a first power amplifier circuit (PA1) 205, a bandpass filter circuit (BPF) 207, and a first transmission terminal (transmission terminal for a 5-GHz-band wireless LAN) TX1 in this order. The bandpass filter circuit 207 removes unnecessary out-of-band noises and harmonics from the transmitting signal. The first power amplifier circuit 205 amplifies a transmitting signal input from the transmission circuit for a 5-GHz-band wireless LAN. The higher-frequency-side filter circuit of the first diplexer circuit 202 also attenuates harmonics.

A lowpass filter circuit for attenuating harmonics generated from the first power amplifier circuit 205 may be disposed between the first diplexer circuit 202 and the first power amplifier circuit 205. A balanced-unbalanced circuit whose balanced terminal is the first transmission terminal may be disposed between the first transmission terminal TX1 and the bandpass filter circuit 207.

Connected to the lower-frequency-side filter circuit of the first diplexer circuit 202 are a second power amplifier circuit (PA2) 206, a bandpass filter circuit (BPF) 208, and a second transmission terminal (transmission terminal for a 2.4-GHz-band wireless LAN) TX2 in this order. The bandpass filter circuit 208 removes unnecessary out-of-band noises from the transmitting signal. The second power amplifier circuit 206 amplifies a transmitting signal input from the transmission circuit for a 2.4-GHz-band wireless LAN. The lower-frequency-side filter circuit of the first diplexer circuit 202 has a function of attenuating harmonics generated from the second power amplifier circuit 206.

The second diplexer circuit (DIP2) 203 is connected to the receiving path side of the switch circuit 201. The second diplexer circuit 203 comprises a lower-frequency-side filter circuit passing a received signal for 2.4-GHz-band wireless LAN but attenuating a received signal for a 5-GHz-band wireless LAN, and a higher-frequency-side filter circuit passing a received signal for a 5-GHz-band wireless LAN but attenuating a received signal for a 2.4-GHz-band wireless LAN.

Connected to the higher-frequency-side filter circuit of the second diplexer circuit 203 are a first low-noise amplifier circuit (LNA1) 210, a bandpass filter circuit (BPF) 213, and a first receiving terminal (receiving terminal for a 5-GHz-band wireless LAN) RX1 in this order. The received signal for a 5-GHz-band wireless LAN received by the antenna passes through the switch circuit 201, and is amplified by the first low-noise amplifier circuit 210 and output to the first receiving terminal RX1. Because the higher-frequency-side filter circuit of the diplexer circuit 203 attenuating signals of 2.5 GHz or less is connected to the input side of the low-noise amplifier circuit 210, the low-noise amplifier circuit 210 can be prevented from saturation by radio waves of 2 GHz or less generated from mobile gears, etc.

Connected to the lower-frequency-side filter circuit of the second diplexer circuit 203 are a bandpass filter circuit (BPF) 212 as the second filter, a second low-noise amplifier circuit (LNA2) 211, and a second receiving terminal (receiving terminal for a 2.4-GHz-band wireless LAN) RX2 in this order. The received signal for a 2.4-GHz-band wireless LAN received by the antenna passes through the switch circuit 201, and is amplified by the second low-noise amplifier LNA2 and output to the second receiving terminal RX2. Because the bandpass filter circuit 212 attenuating signals of 2 GHz or less is connected to the input side of the low-noise amplifier circuit 211, unnecessary signals are removed from signals sent from the antenna terminal. Particularly the bandpass filter circuit 212 sufficiently attenuates signals of about 2 GHz or less from cell phones, preventing the saturation of the second low-noise amplifier circuit 211.

Figure 24:
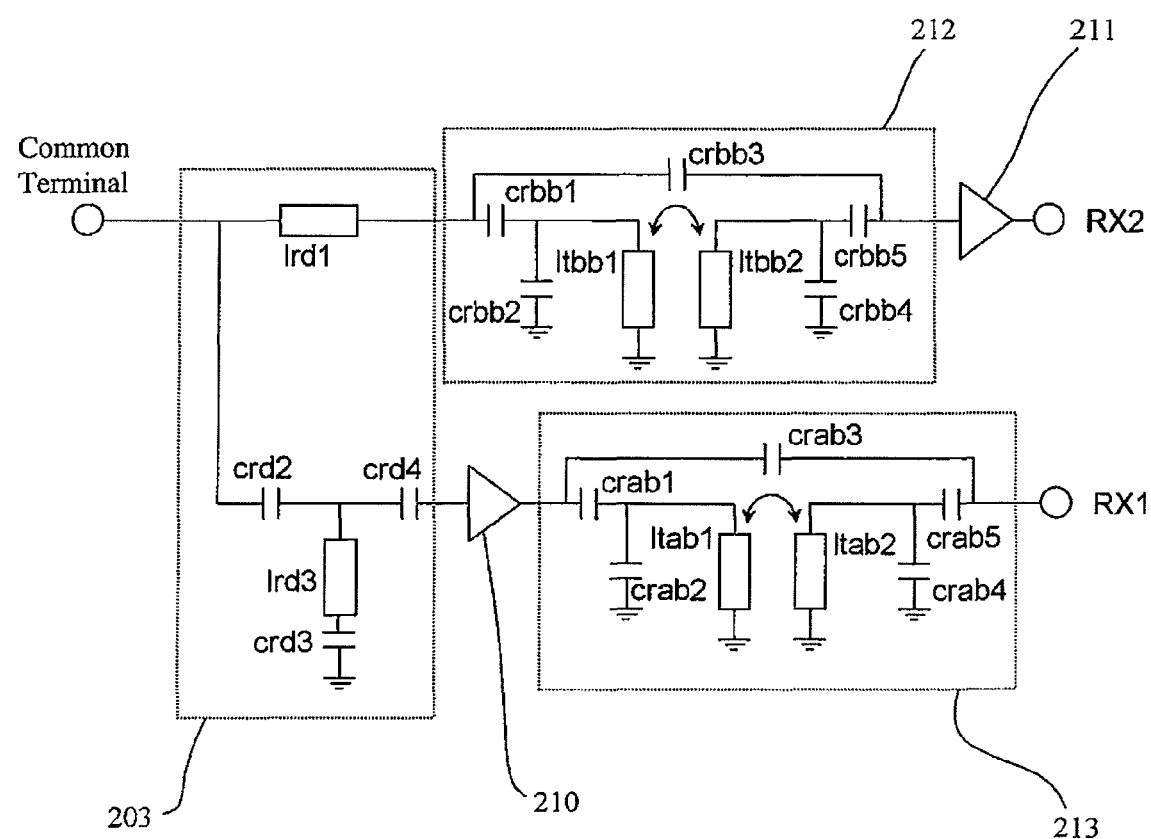
FIG. 24 is a view showing a equivalent circuit of a diplexer circuit and a bandpass filter circuit according to the second embodiment of the present invention.

FIG. 24 shows the equivalent circuits of the diplexer circuit 203, the bandpass filter circuit 212, and the bandpass filter circuit 213. The diplexer circuit 203 is constituted by transmission lines lrd1, lrd3 and capacitance elements crd2-crd4. The capacitance element crd3 and the transmission lines lrd3 are adjusted to have resonance in a 2.4-GHz band. The electric length of the transmission lines lrd1 is adjusted, such that when the bandpass filter 212 is viewed from the common terminal of the diplexer circuit 103, the impedance is regarded as being open in a 5-GHz band. Thus, a signal in a 2.4-GHz band is sent to the bandpass filter circuit 212, while a signal in a 5-GHz band is sent to the low-noise amplifier circuit 210. After unnecessary out-of-band signals are removed by the bandpass filter circuit 212, the signal in a 2.4-GHz band is amplified by the low-noise amplifier 211 and output to the second receiving terminal RX2. After amplified by the low-noise amplifier 210, unnecessary out-of-band signals are removed from the signal in a 5-GHz band by the bandpass filter circuit 213, and the signal in a 5-GHz band is output to the first receiving terminal RX1.

Figure 25:
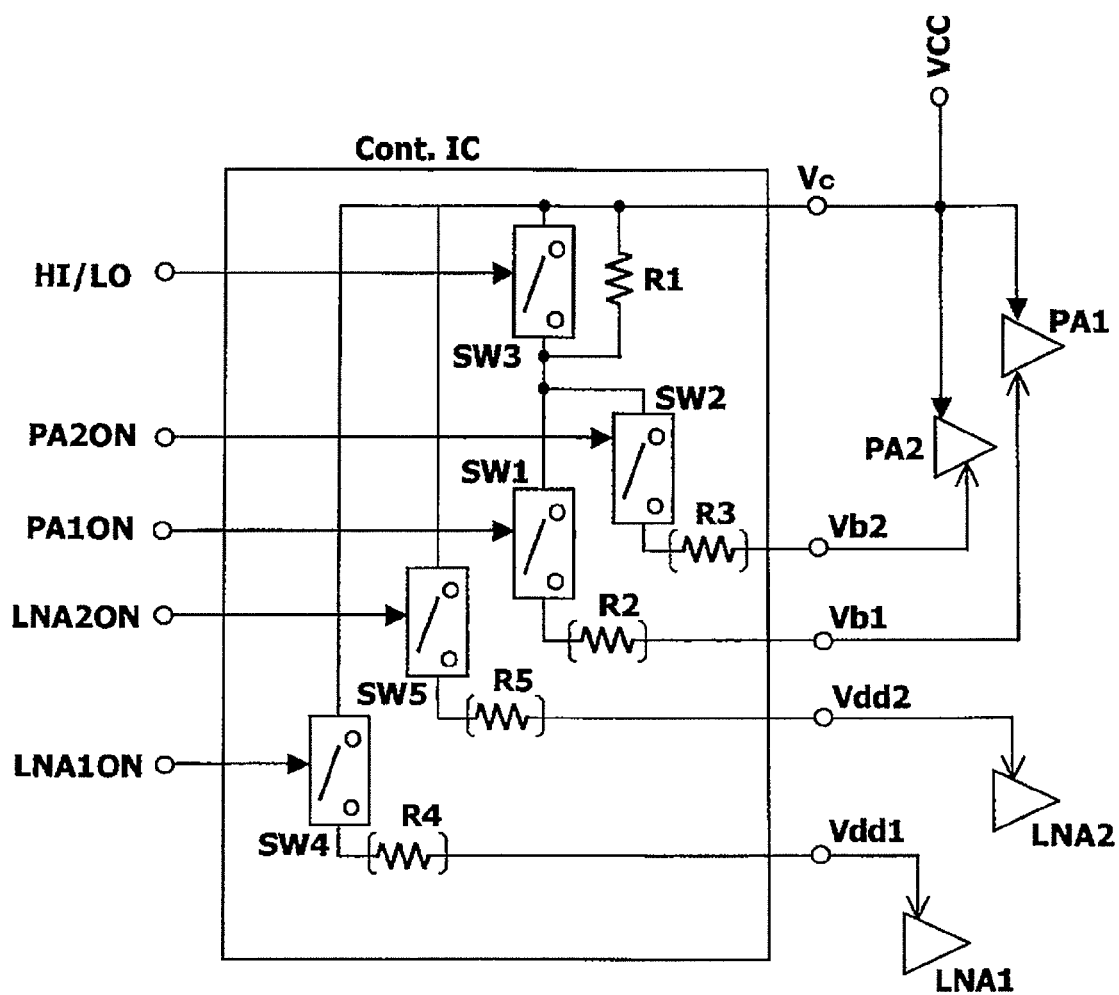
FIG. 25 is a block diagram showing a control circuit according to the second embodiment of the present invention.
Figure 26:
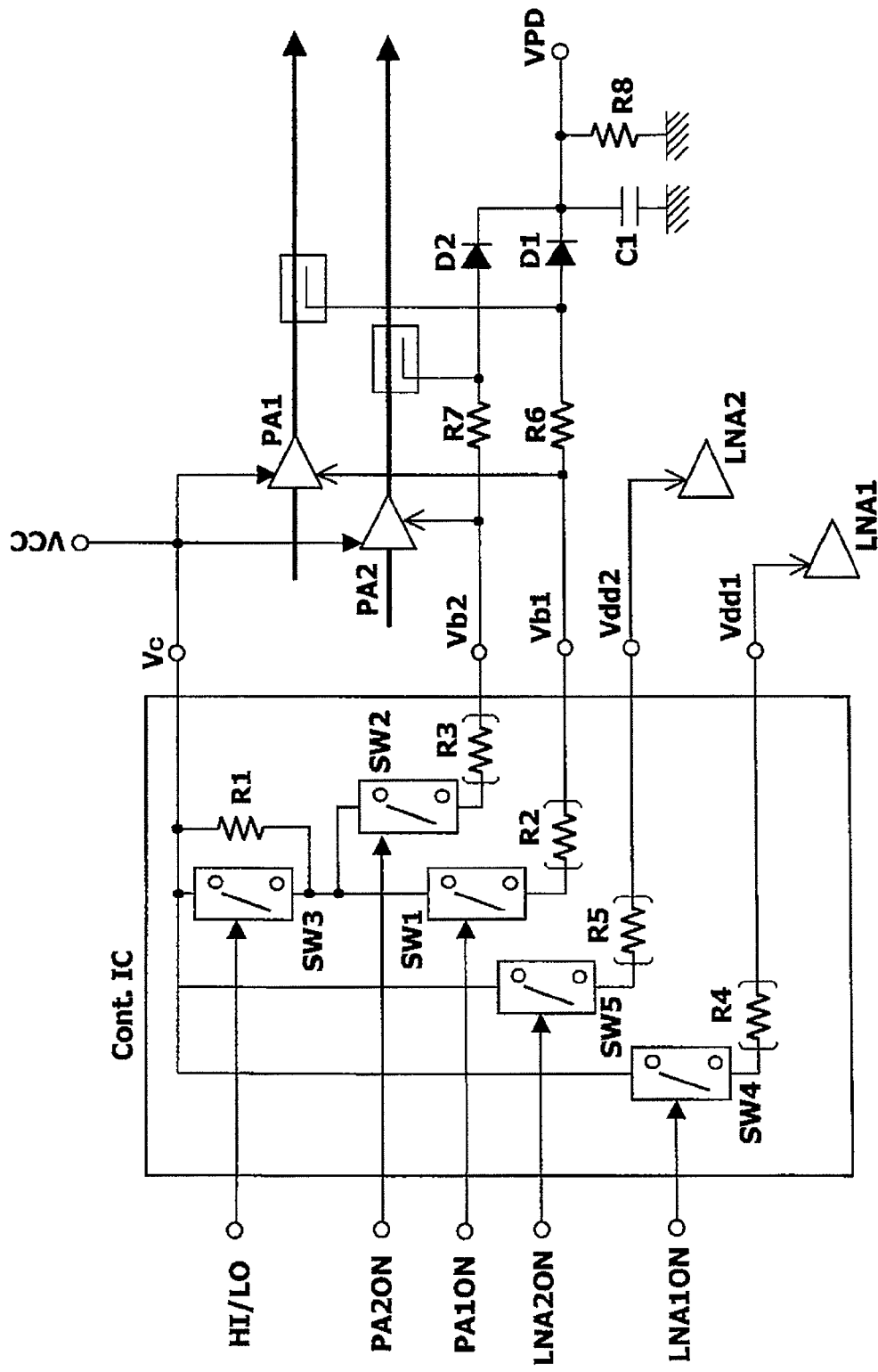
FIG. 26 is a block diagram showing a control circuit and a detection circuit according to the second embodiment of the present invention.

As shown in FIG. 23, the high-frequency circuit comprises a voltage-applying terminal VCC for applying a constant voltage to the first and second power amplifier circuits 205, 206, and a control circuit (Cont. IC) 204 receiving voltage from the voltage-applying terminal VCC. Each of the first and second power amplifier circuits 205, 206 contains a detection diode, whose detection output is output to one detection terminal VPD. FIG. 25 shows the structure of the control circuit 204, and FIG. 26 shows a preferred example of detection diodes and the control circuit 204. The control circuit 104 comprises a terminal Vdd1 for outputting bias voltage for the first low-noise amplifier circuit (LNA 1), a terminal Vdd2 for outputting bias voltage for the second low-noise amplifier circuit (LNA2), a fourth switch (SW4) for turning on or off bias voltage for the first low-noise amplifier circuit (LNA1), a fifth switch (SW5) for turning on or off bias voltage for the second low-noise amplifier circuit (LNA2), a terminal LNA1ON for inputting a signal for the ON/OFF control of the fourth switch (SW4), and a terminal LNA2ON for inputting a signal for the ON/OFF control of the fifth switch (SW5). Because the other structures are the same as those of the control circuit and the detection diodes shown in FIGS. 2 and 3, their explanation will be omitted.

The switch circuit 201 and the highpass filter circuit 218 may be the same as shown in FIG. 1. To avoid the saturation of the low-noise amplifier by interference signals, a bandpass filter 212 and a diplexer circuit 203 are disposed on the input side of the low-noise amplifier, and a highpass filter circuit may be added. The highpass filter circuit preferably has one or more attenuation poles at, for instance, about 0.8-2 GHz. This can be achieved by the series resonance circuit of an inductance element L12 and a capacitance element C12 shown in FIG. 4. This attenuates signals at about 0.8-2 GHz and nearby frequencies, and stably removes interference from cell phones.

Because the 2.4-GHz band of a wireless LAN is close to the band of cell phones, one highpass filter circuit would unlikely provide desirable attenuation. Accordingly, pluralities of highpass filter circuits may be disposed. In this case, highpass filter circuits may be disposed between the switch circuit 201 and the low-noise amplifier circuits 210, 211. Such highpass filter circuits may be as shown in FIG. 4, 6 or 7.

The diplexer circuits 202, 203 and the bandpass filter circuits 207, 208, 212, 213 can be constituted by LC circuits of inductance elements and capacitance elements.

Figure 27:
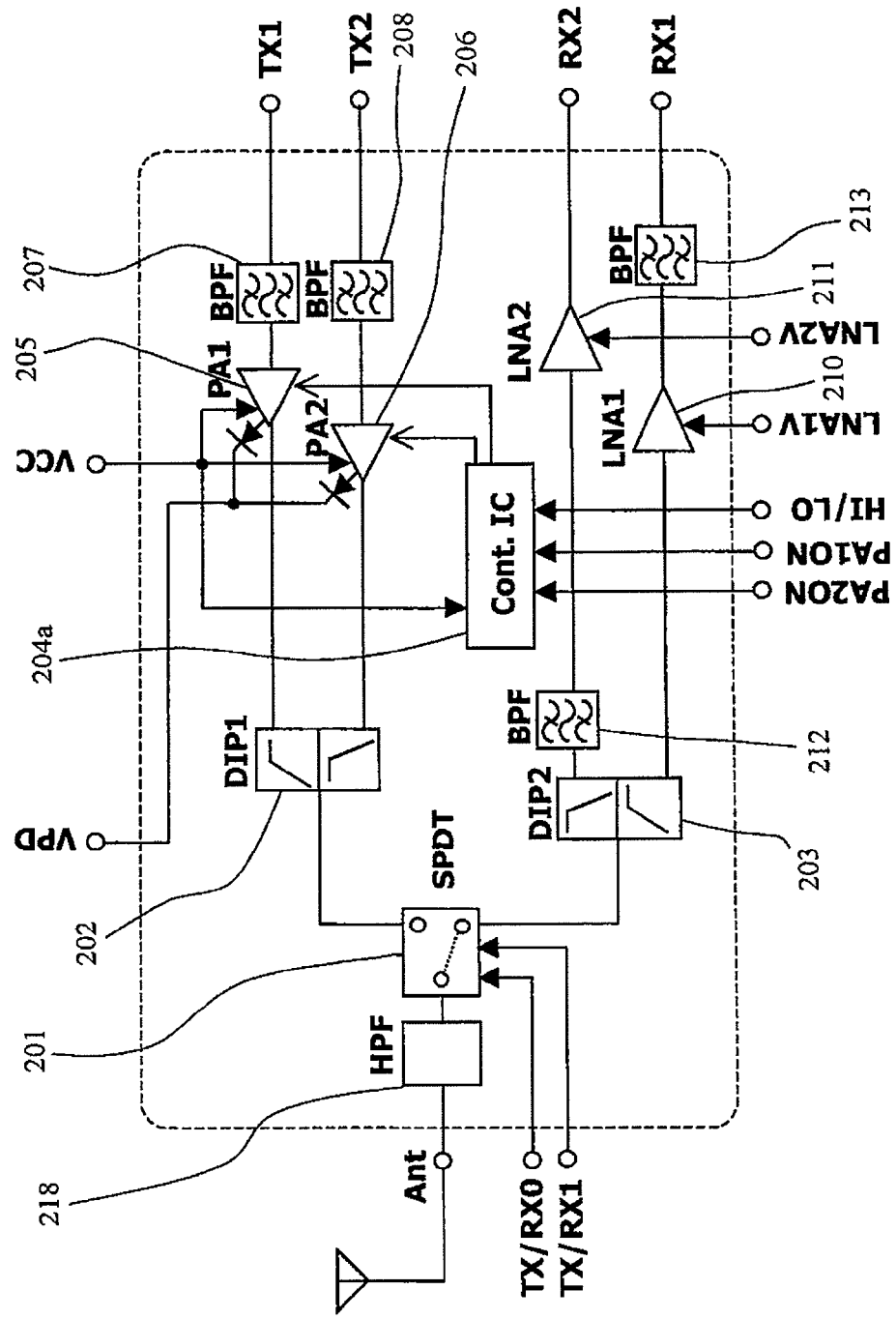
FIG. 27 is a block diagram showing another example of high-frequency circuits according to the second embodiment of the present invention.
Figure 28:
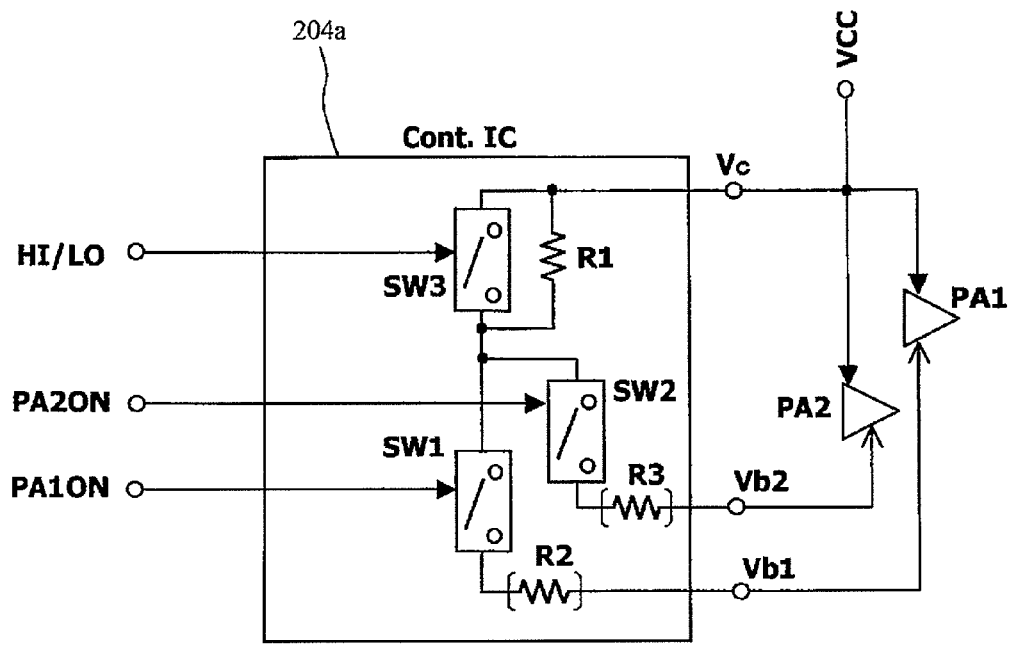
FIG. 28 is a block diagram showing a control circuit according to the second embodiment of the present invention.

FIG. 27 shows another example of high-frequency circuits in this embodiment. This high-frequency circuit is different from the circuit shown in FIG. 23 in the control circuit (Cont. IC) 204a. The structure of the control circuit 204a is shown in FIG. 28. The control circuit 204a comprises a voltage-inputting terminal Vc to be connected to the voltage-applying terminal VCC, a terminal Vb1 for outputting bias voltage for the first power amplifier circuit (PA1), a terminal Vb2 for outputting bias voltage for the second power amplifier circuit (PA2), a first switch (SW1) for turning on or off bias voltage for the first power amplifier circuit, a second switch (SW2) for turning on or off bias voltage for the second power amplifier circuit, a third switch (SW3) disposed between a common terminal of the first and second switches and the voltage-inputting terminal Vc, a resistor R1 parallel-connected to the third switch (SW3), a terminal PA1ON for inputting a signal for the ON/OFF control of the first switch (SW1), a terminal PA2ON for inputting a signal for the ON/OFF control of the second switch (SW2), and a terminal HI/LO for inputting a signal for the ON/OFF control of the third switch (SW3). Their structures may be the same as described above.

The arrangement of a terminal LNA1V for bias voltage for the first low-noise amplifier circuit LNA1 and a terminal LNA2V for bias voltage for the second low-noise amplifier circuit LNA2 is different from that shown in FIG. 23. Because current for driving the bias voltage terminals LNA1V, LNA2V is as relatively small as about 0.1 mA, they can be directly driven by a logic control power supply integrated with an RFIC or a baseband IC.

The structure of this control circuit may be used not only in the high-frequency circuit in this embodiment, but also in other high-frequency circuits having different filter arrangement (for instance, high-frequency circuit free from the first filter).

(B) High-frequency Device

Figure 29:
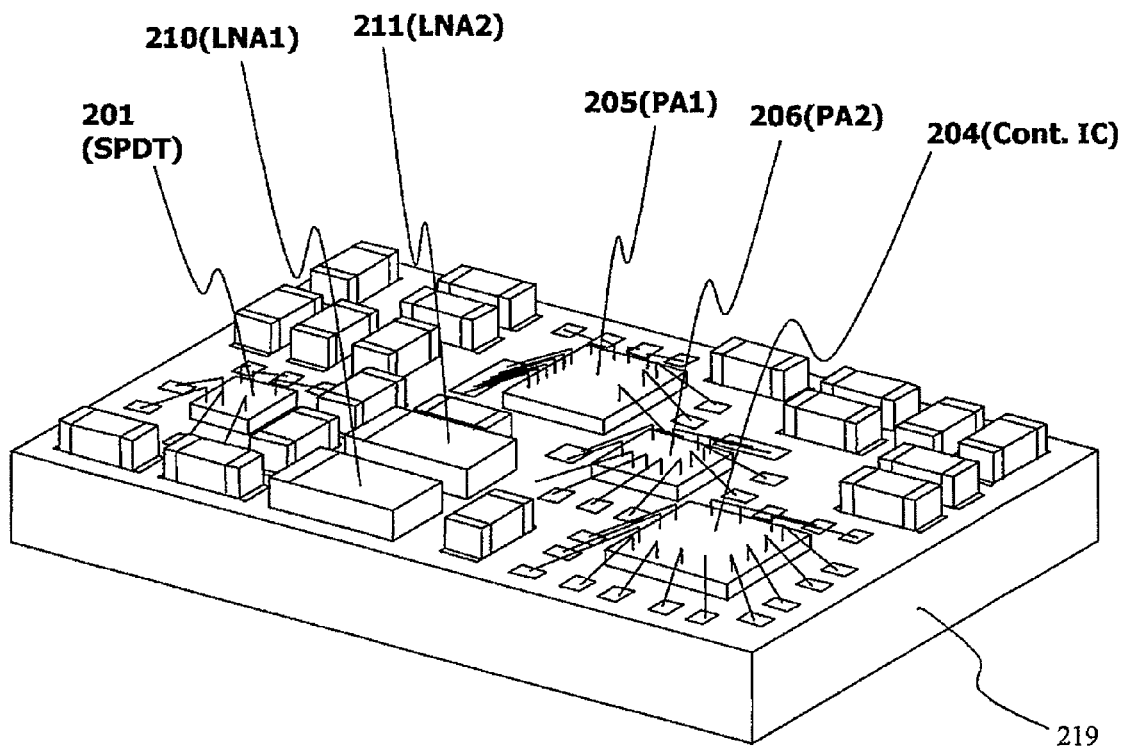
FIG. 29 is a perspective view showing a high-frequency device according to the second embodiment of the present invention.

FIG. 29 shows a high-frequency device having the high-frequency circuit according to the second embodiment of the present invention, which is constituted as a ceramic laminate device. Because the ceramic laminate device 219 can be produced by the same method as in the first embodiment, the explanation of its production method will be omitted.

Each layer in the ceramic laminate device 219 is provided with pattern electrodes for inductance elements, capacitance elements, wiring lines and ground electrodes, and the pattern electrodes are connected by via-hole electrodes. LC circuit structures are mainly formed by pattern electrodes. Specifically, the first and second diplexer circuits 202, 203 and the bandpass filter circuits 207, 208, 212, 213 are mainly formed by pattern electrodes in the multilayer ceramic substrate 219, and part of each circuit is mounted as a chip device on a top surface of the multilayer ceramic substrate 219.

Semiconductor devices for a switch circuit (SPDT) 201, first and second power amplifier circuits (PA1) 205, (PA2) 206, first and second low-noise amplifier circuits (LNA1) 210, (LNA2) 211, and a control circuit (Cont. IC) 204 are mounted on the ceramic laminate device 219. These semiconductor devices are connected to pattern electrodes in the ceramic laminate device 219 by a wire bonder, LGA, BGA, etc. Particularly with a semiconductor device for the control circuit mounted, the high-frequency circuit can be miniaturized. Part of the switch circuit 201, the first and second power amplifier circuits 205, 206, the first and second low-noise amplifier circuits 210, 211, and the control circuit 204 are contained in the ceramic laminate device. The mounted devices and the contained elements are connected to form the circuit shown in FIG. 23. The ceramic laminate device 219 has chip capacitors, chip resistors, chip inductors, etc. mounted in addition to the above semiconductor devices, and these mounted devices can be properly selected referring to relations with the elements contained in the ceramic laminate device 219.

[3] Third Embodiment (A) High-frequency Circuit

Figure 30:
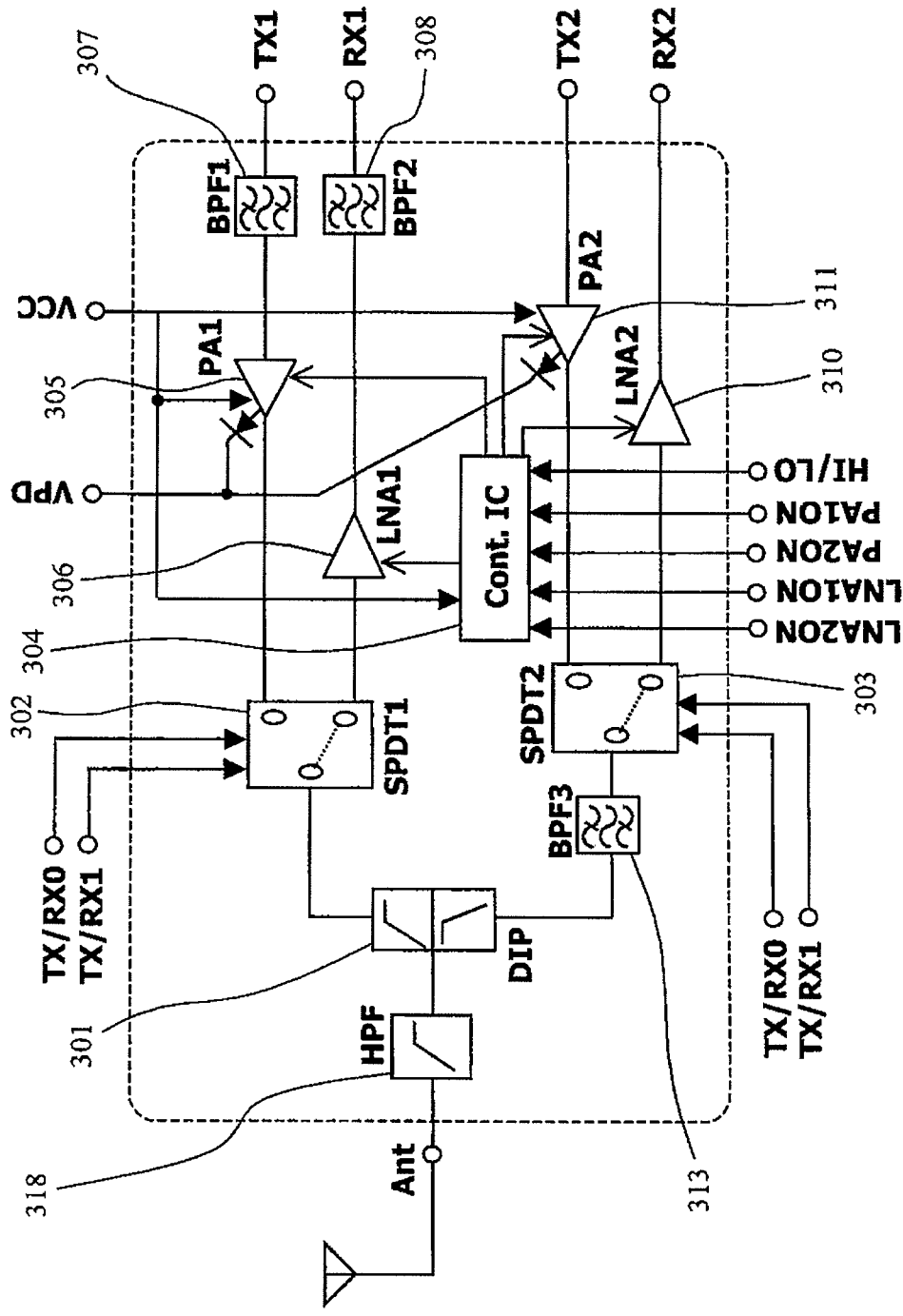
FIG. 30 is a block diagram showing one example of high-frequency circuits according to the third embodiment of the present invention.

FIG. 30 shows a high-frequency circuit according to a still further embodiment of the present invention commonly usable in two communications systems of a 5-GHz-band wireless LAN (IEEE802.11a) and a 2.4-GHz-band wireless LAN (IEEE802.11b and/or IEEE 802.11g). This high-frequency circuit comprises a highpass filter circuit (HPF) 318 as a first filter connected to an antenna terminal Ant to be connected to the multiband antenna, and a diplexer circuit (DIP) 301. The diplexer circuit 301 comprises a higher-frequency-side filter circuit passing transmission and received signals for a 5-GHz-band wireless LAN but attenuating transmission and received signals for a 2.4-GHz-band wireless LAN, and a lower-frequency-side filter circuit passing transmission and received signals for a 2.4-GHz-band wireless LAN but attenuating transmission and received signals for a 5-GHz-band wireless LAN.

The higher-frequency-side filter circuit of the diplexer circuit 301 is connected to a first switch circuit (SPDT1) 302 for switching the connections of the antenna-side circuit to a transmission path and a receiving path. Connected to the transmission path of the switch circuit 302 are a first power amplifier circuit (PA1) 305, a first bandpass filter circuit (BPF1) 307, and a first transmission terminal (transmission terminal for a 5-GHz-band wireless LAN) TX1 in this order. Connected to the receiving path of the first switch circuit 302 are a first low-noise amplifier circuit (LNA1) 306, a second bandpass filter circuit (BPF2) 308, and a first receiving terminal (receiving terminal for a 5-GHz-band wireless LAN) RX1 in this order. The first bandpass filter circuit 307 removes unnecessary out-of-band noises from the transmitting signal. The first power amplifier circuit 305 amplifies a transmitting signal for a 5-GHz-band wireless LAN. The lower-frequency-side filter circuit of the diplexer circuit 301 attenuates harmonics. A balanced-unbalanced circuit whose balanced terminal is the first transmission terminal may be disposed between the first transmission terminal TX1 and the bandpass filter circuit 307.

The lower-frequency-side filter circuit of the diplexer circuit 301 is connected to a second switch circuit (SPDT2) 303 for switching the connections of the antenna-side circuit to a transmission path and a receiving path, via a third bandpass filter circuit (BPF3) 313 as a second filter. Connected to the transmission path of the switch circuit 303 are a second power amplifier circuit (PA2) 311, and a second transmission terminal (transmission terminal for a 2.4-GHz-band wireless LAN) TX2 in this order. Connected to the receiving path of the second switch circuit 303 are a second receiving terminal (receiving terminal for a 2.4-GHz-band wireless LAN) RX2 via a second low-noise amplifier circuit (LNA2) 310. The second power amplifier circuit (PA2) 311 amplifies a transmitting signal input from the transmission circuit for a 2.4-GHz-band wireless LAN, and the third bandpass filter circuit 313 and the lower-frequency-side filter circuit of the diplexer circuit 301 remove unnecessary out-of-band noises from the transmitting signal and attenuate harmonics generated from the second power amplifier circuit 311. A bandpass filter for removing unnecessary out-of-band noise from the transmitting signal may be added between the second transmission terminal (transmission terminal for a 2.4-GHz-band wireless LAN) TX2 and the second power amplifier circuit 311.

The received signal (2.4-GHz band) from the diplexer circuit 301 passes through the third bandpass filter circuit (BPF3) 313 and the second switch circuit (SPDT2) 303 and enters the second low-noise amplifier circuit (LNA2) 310, resulting in being amplified and output to the second receiving terminal RX2. Unnecessary signals in the received signal are removed by the diplexer circuit 301 and the third bandpass filter circuit 313. Particularly the third bandpass filter circuit 313 sufficiently attenuates signals of about 2 GHz or less from a cell phone, which saturates the second low-noise amplifier circuit 310.

Figure 31:
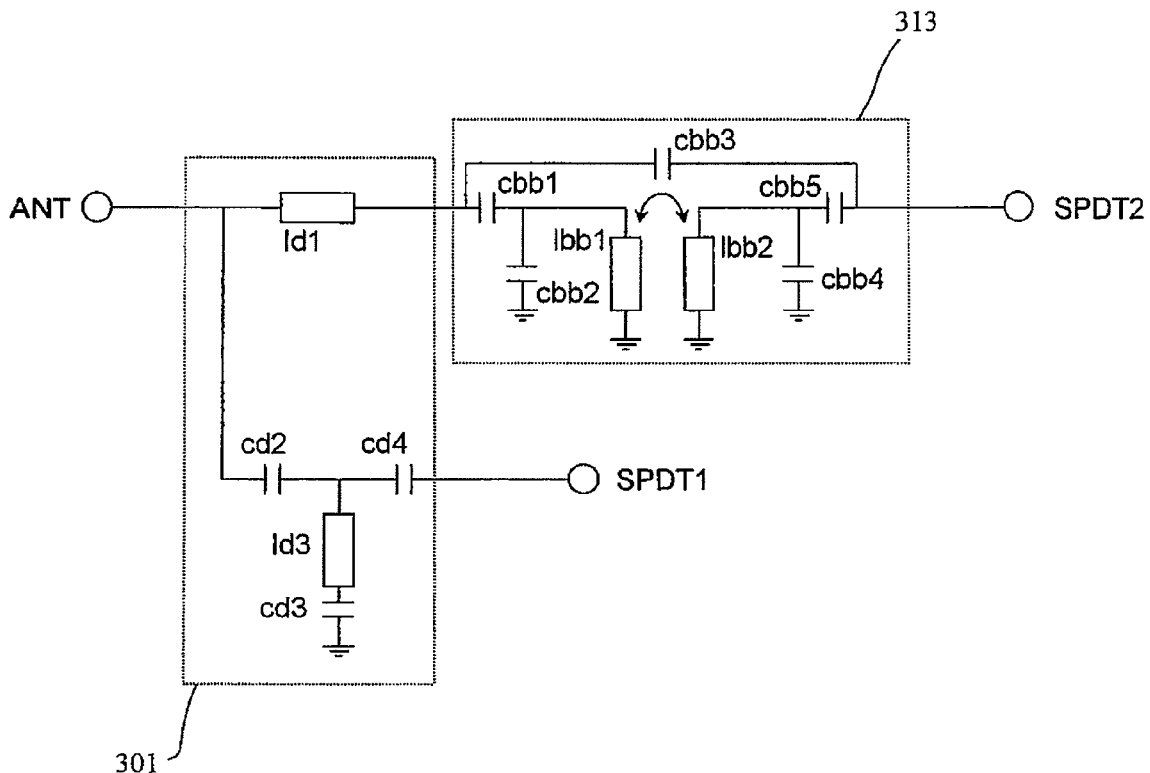
FIG. 31 is a view showing equivalent circuits of a diplexer circuit and a third bandpass filter circuit according to the third embodiment of the present invention.

FIG. 31 shows equivalent circuits of the diplexer circuit 301 and the third bandpass filter circuit 313. The diplexer circuit 301 is constituted by transmission lines ld1, ld3 and capacitance elements cd2-cd4. The capacitance element cd3 and the transmission lines ld3 are adjusted to be resonated in a 2.4-GHz band. The electric length of the transmission lines ld1 is adjusted such that the impedance is regarded as being open in a 5-GHz band when the bandpass filter 313 is viewed from the terminal ANT. Thus, a signal in a 2.4-GHz band is sent to the bandpass filter circuit 313, while a signal in a 5-GHz band is sent to the switch circuit 302 (SPDT1). After unnecessary out-of-band signals are removed by the bandpass filter circuit 313, the signal in a 2.4-GHz band passes the switch circuit 303 (SPDT2) and enters the low-noise amplifier circuit 310, resulting in being amplified and output to the second receiving terminal RX2. The signal in a 5-GHz band passes the switch circuit 302 and enters the low-noise amplifier circuit 306, where it is amplified. With unnecessary out-of-band signals removed by the bandpass filter circuit 308, the signal in a 5-GHz band is output to the first receiving terminal RX1.

A voltage-applying terminal VCC applies constant voltage to the first and second power amplifier circuits 305, 311 and the control circuit (Cont. IC) 304. Each of the first and second power amplifier circuits 305, 311 contains a detection diode, whose detection output is output to one detection terminal VPD.

Because the switch circuits 302, 303 and the highpass filter circuit 318 may be the same as in the first embodiment, their explanation will be omitted. Also, because the control circuit 304 and the detection diode may be the same as in the second embodiment, their explanation will be omitted.

Figure 32:
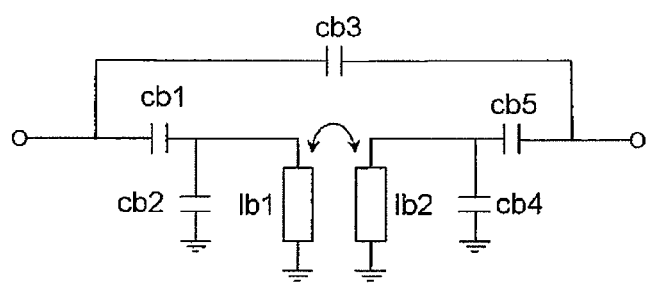
FIG. 32 is a view showing a equivalent circuit of a bandpass filter circuit according to the third embodiment of the present invention.

FIG. 32 shows one example of equivalent circuits of the bandpass filter circuit. This bandpass filter circuit is constituted by magnetically coupled inductance elements lb1, lb2 and capacitance elements cb1-cb5. The parallel resonance frequency of the inductance element lb1 and the capacitance element cb2, and the parallel resonance frequency of the inductance element lb2 and the capacitance element cb4 are set to be a passband, a 2.4-GHz band or a 5-GHz band. However, the structure of the bandpass filter circuit is not restricted thereto.

The diplexer circuit 301 and the bandpass filter circuits 307, 308, 313cb constituted by LC circuits of inductance elements and capacitance elements. Among the pattern electrodes in the laminate device, transmission lines form the inductance elements, and parallel electrodes form the capacitance elements.

Figure 33:
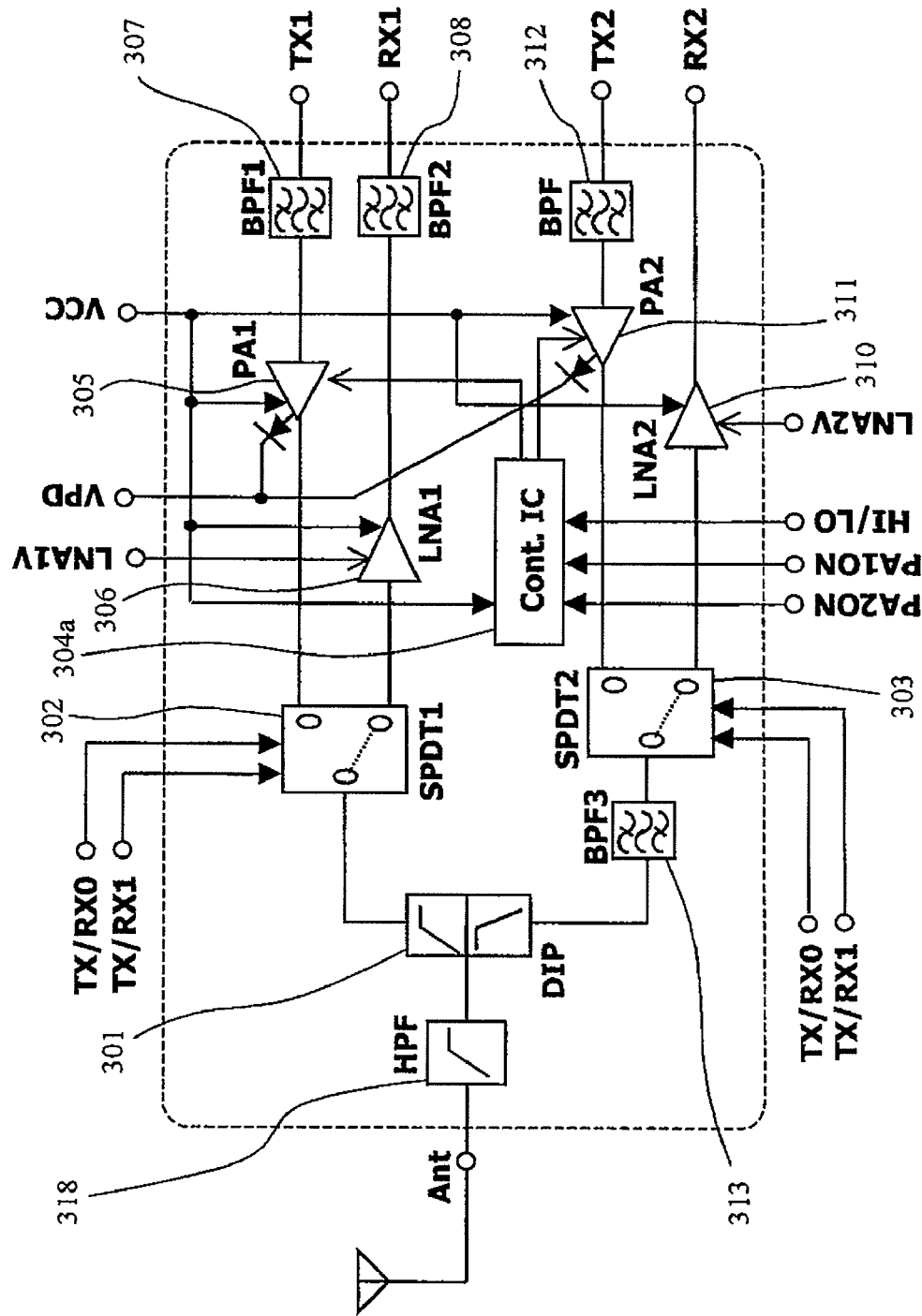
FIG. 33 is a block diagram showing another example of high-frequency circuits according to the third embodiment of the present invention.

FIG. 33 shows another example of high-frequency circuits in this embodiment. Although this high-frequency circuit differs from the high-frequency circuit shown in FIG. 30 in a control circuit (Cont. IC) 304a, the control circuit 304a has the same structure as in the second embodiment shown in FIG. 25. Accordingly, its explanation will be omitted. The control circuit 304a can be used not only in the high-frequency circuit in this embodiment, but also in a high-frequency circuit having no first filter, for instance. A bandpass filter circuit 312 is disposed between the second power amplifier circuit (PA2) 311 and the second transmission terminal TX2.

(B) High-frequency Device

Figure 34:
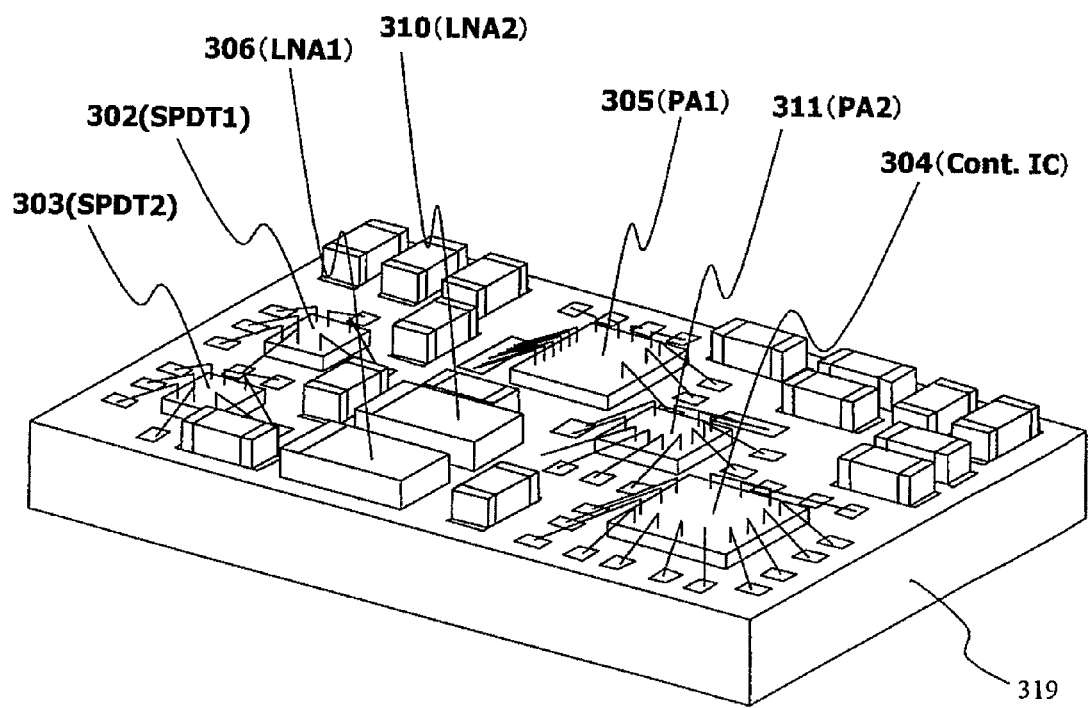
FIG. 34 is a perspective view showing a high-frequency device according to the third embodiment of the present invention.
Figure 35:
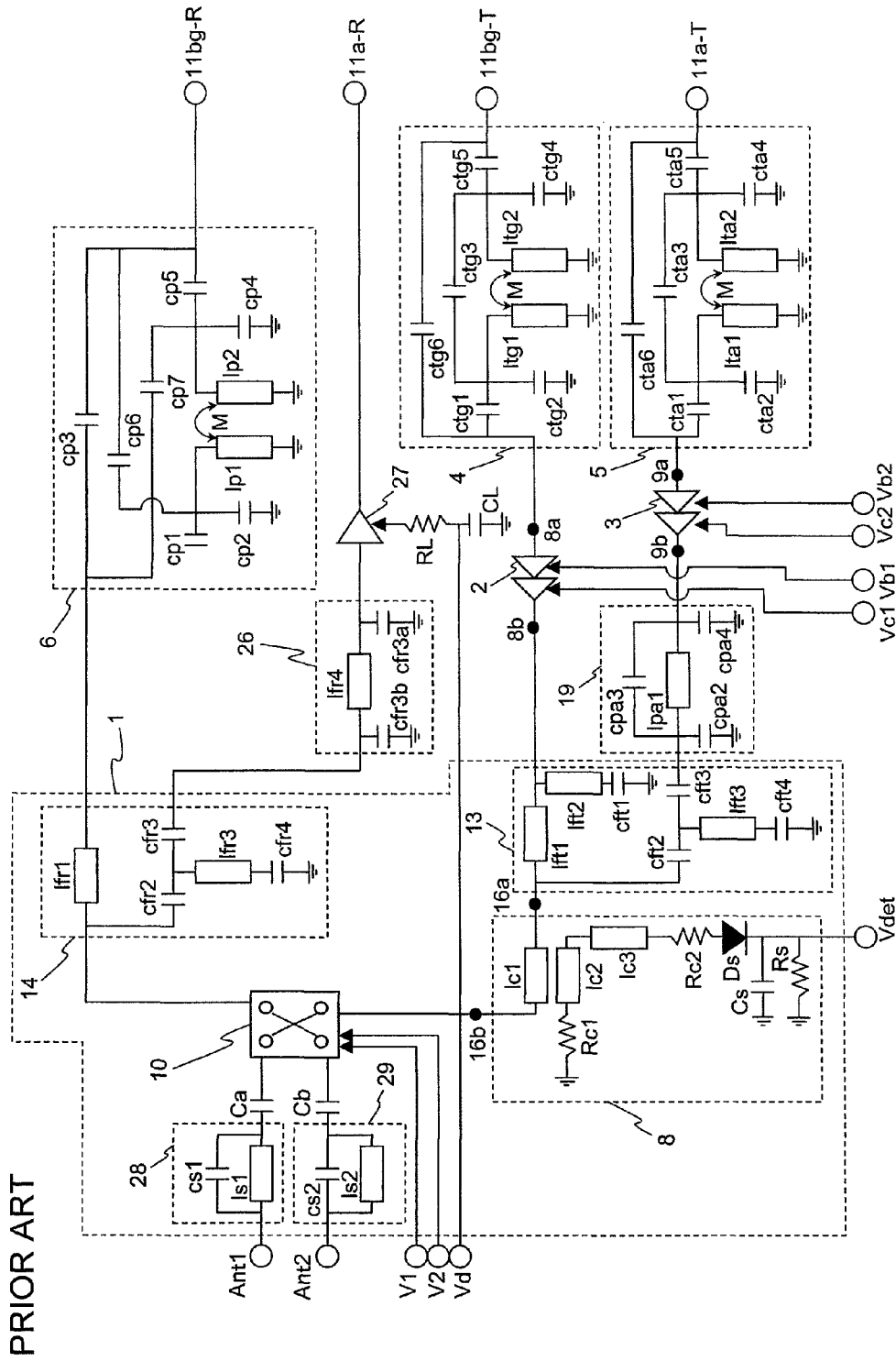
FIG. 35 is a view showing a equivalent circuit of one example of conventional high-frequency circuits.
Figure 36:
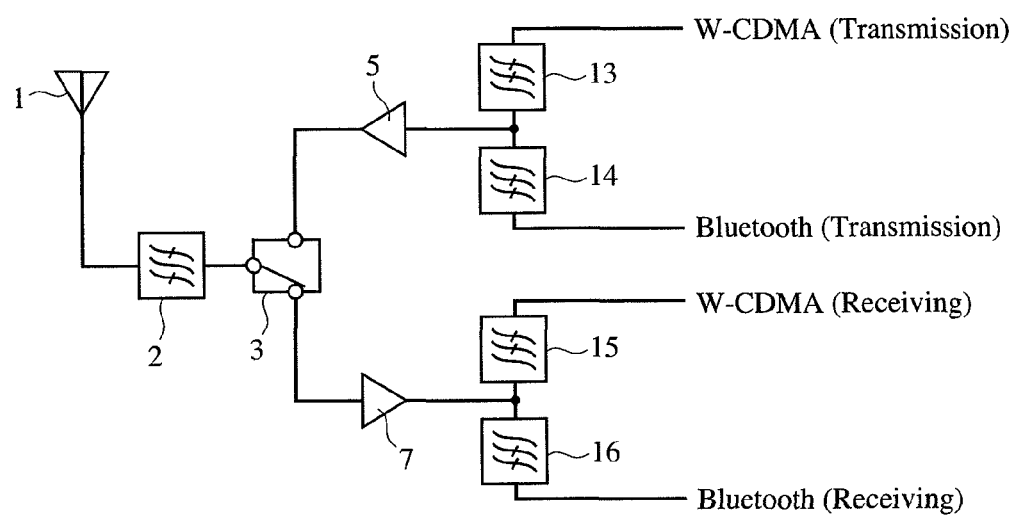
FIG. 36 is a block diagram showing another example of conventional high-frequency circuits.

FIG. 34 shows a high-frequency device having the high-frequency circuit in this embodiment, which is constituted as a ceramic laminate device. Because the production method of the ceramic laminate device 319 is the same as in the first embodiment, its explanation will be omitted.

Each layer in the ceramic laminate device 319 is provided with pattern electrodes for inductance elements, capacitance elements, wiring lines and ground electrodes, and the pattern electrodes are connected through via-hole electrodes. Elements for main parts of the diplexer circuit 301, the first and second switches circuits 302, 303, the first and second power amplifier circuits 305, 311, the first and second low-noise amplifier circuits 306, 310, the bandpass filter circuits 307, 308, 313, and the control circuit 304 are formed in or on the ceramic laminate device 319, and other elements (chip capacitors, chip resistors, chip inductors, etc.) are mounted on a top surface of the multilayer ceramic substrate 319. The mounted devices are connected by a wire bonder, LGA, BGA, etc. Particularly with semiconductor devices for the control circuit mounted, the high-frequency circuit can be miniaturized. The mounted devices and the connected elements are connected to form the circuit shown in FIG. 30.

The high-frequency circuit of the present invention has good receiving sensitivity. In a conventional high-frequency circuit comprising a diplexer circuit and a bandpass filter circuit on the input side of a low-noise amplifier on the higher frequency side, the noise index of the receiving path is 3.5 dB in a 2.4-GHz band and 4.0 dB in a 5-GHz band. On the other hand, in the high-frequency circuit in the first embodiment, the noise index is as extremely small as 1.5 dB in a 2.4-GHz band and 2 dB in a 5-GHz band. Also, in the high-frequency circuits in the second and the third embodiments, the noise index is as extremely small as 2 dB in a 5-GHz band.

Because the ceramic laminate device can be formed to an extremely small size of 6 mm×4 mm×0.6 mm in any embodiment, the height of the high-frequency device of the present invention can be as small as 1.3 mm even with bare-chip-mounted semiconductor devices sealed with a resin. Because even conventional small high-frequency devices have a planar size of about 9 mm×about 6 mm, the high-frequency device of the present invention has a half planar size or less. With such a small high-frequency device mounted, the wireless apparatus can be miniaturized, resulting in increased freedom of design. The use of pluralities of high-frequency devices enables a front-end part capable of switching pluralities of antennas to transmission paths and receiving paths. This provides a wireless LAN communications apparatus adapted to an IEEE 802.11n standard having high communications speed and quality.

The high-frequency circuit of the present invention can be used not only for dual-band wireless apparatuses, but also for multiband (triple-band, a quad-band, etc.) wireless apparatuses. In this case, the high-frequency circuit of the present invention need only be used as part of the multiband high-frequency circuit.

EFFECT OF THE INVENTION

The high-frequency circuit and high-frequency device of the present invention have good receiving sensitivity in wireless communications among electronic or electric apparatuses. Also, for instance, a circuit commonly usable in two communications systems of IEEE 802.11a in a 5-GHz band and IEEE 802.11b and/or IEEE 802.11g in a 2.4-GHz band, or a circuit corresponding to IEEE 802.11n can be constituted as a small, low-current-consumption, high-frequency device. Thus obtained is, for instance, a communications apparatus in a cell phone, etc. comprising a dual-band RF front-end circuit having first and second frequency bands of 5 GHz and 2.4 GHz, respectively, and capable of being used for communications systems of IEEE 802.11a, IEEE 802.11b and IEEE 802.11g.

What is claimed is:

1. A high-frequency circuit for wireless communications selectively using at least a first frequency band and a second frequency band lower than said first frequency band, comprising
an antenna terminal;
a first transmission terminal to which a transmitting signal in said first frequency band is input;
a second transmission terminal to which a transmitting signal in said second frequency band is input;
a first receiving terminal from which a received signal in said first frequency band is output;
a second receiving terminal from which a received signal in said second frequency band is output;
a switch circuit, comprising a switch transmission terminal and a switch receiving terminal, for switching the connection of said antenna terminal to said first and second transmission terminals and the connection of said antenna terminal to said first and second receiving terminals;
a first diplexer circuit disposed between said switch circuit and said first and second transmission terminals;
a second diplexer circuit disposed between said switch circuit and said first and second receiving terminals;
a first power amplifier circuit disposed between said first diplexer circuit and said first transmission terminal;
a second power amplifier circuit disposed between said first diplexer circuit and said second transmission terminal;
a low-noise amplifier circuit coupled to an antenna side of the second diplexer circuit and disposed between said switch circuit and said second receiving terminal for amplifying at least a received signal in said second frequency band;
a first highpass filter circuit which is disposed in a line between said antenna terminal and said switch circuit, and is coupled to the antenna terminal and an antenna side of the switch circuit; and a second highpass filter circuit which is disposed in a line between said switch circuit and said low-noise amplifier circuit, and is coupled to the switch receiving terminal and an input of the low-noise amplifier circuit, the first highpass filter circuit and the second highpass filter circuit passing a received signal in said second frequency band while blocking a frequency band lower than said second frequency band, and a band blocked by said first highpass filter circuit being lower than a band blocked by said second highpass filter circuit.

2. The high-frequency circuit according to claim 1, comprising a bypass parallel-connected to said low-noise amplifier circuit.

3. The high-frequency circuit according to claim 2, wherein said second filter circuit is disposed between a branching point of said bypass and said low-noise amplifier circuit, and said low-noise amplifier circuit.

4. The high-frequency circuit according to claim 1, comprising a voltage-applying terminal for applying constant voltage to said first and second power amplifier circuits, and a control circuit receiving voltage from said voltage-applying terminal and outputting a control bias voltage to said first and second power amplifier circuits and said low-noise amplifier circuit.

5. The high-frequency circuit according to claim 4, wherein said control circuit comprising a voltage-inputting terminal, a terminal for outputting bias voltage for said first power amplifier circuit, a terminal for outputting bias voltage for said second power amplifier circuit, a terminal for outputting bias voltage for said low-noise amplifier circuit, a first switch for turning on or off bias voltage for said first power amplifier circuit, a second switch for turning on or off bias voltage for said second power amplifier circuit, a third switch for turning on or off bias voltage for said low-noise amplifier circuit, a fourth switch disposed between a common terminal of said first and second switches and said voltage-inputting terminal, a resistor parallel-connected to said fourth switch, and first to fourth signal-inputting terminals for the ON/OFF control of said first to fourth switches.

6. The high-frequency circuit according to claim 1, wherein another low-noise amplifier circuit for amplifying a received signal in said first frequency band is disposed between said switch circuit and said first receiving terminal, and said second diplexer circuit is disposed between (a) said low-noise amplifier circuit and said other low-noise amplifier circuit, and (b) said switch circuit.

7. A high-frequency device having the high-frequency circuit recited in claim 1, comprising an integral laminate comprising pluralities of dielectric ceramic layers provided with pattern electrodes, and devices mounted on said laminate, said first and second diplexer circuits being formed by said pattern electrodes in said laminate, and semiconductor devices for said switch circuit, said first and second power amplifier circuits and said low-noise amplifier circuit being mounted on said laminate.

8. A communications apparatus comprising the high-frequency device recited in claim 7.

9. The high-frequency circuit according to claim 1, wherein:

the first highpass filter circuit is an only filter circuit which is disposed between said antenna terminal and said switch circuit, thereby comprising the only filter circuit disposed on a common path by which the signals in the first frequency band and in the second frequency band are transmitted and received to and from the antenna, and the second highpass filter circuit is an only filter circuit which is disposed between said switch circuit and said low-noise amplifier circuit, thereby comprising the only filter circuit disposed on a common path by which the signals in the first frequency band and in the second frequency band are received by the switch circuit via the receiving terminal.

10. A high-frequency circuit for wireless communications selectively using at least a first frequency band and a second frequency band lower than said first frequency band, comprising an antenna terminal;

a first transmission terminal to which a transmitting signal in said first frequency band is input;

a second transmission terminal to which a transmitting signal in said second frequency band is input;

a first receiving terminal from which a received signal in said first frequency band is output;

a second receiving terminal from which a received signal in said second frequency band is output;

a switch circuit for switching the connection of said antenna terminal to said first and second transmission terminals and the connection of said antenna terminal to said first and second receiving terminals;

a first diplexer circuit disposed between said switch circuit and said first and second transmission terminals;

a second diplexer circuit which comprises a first diplexer receiving terminal and a second diplexer receiving terminal and is disposed between said switch circuit and said first and second receiving terminals;

a first power amplifier circuit disposed between said first diplexer circuit and said first transmission terminal;

a second power amplifier circuit disposed between said first diplexer circuit and said second transmission terminal;

a first low-noise amplifier circuit coupled to the first diplexer receiving terminal and disposed between said second diplexer circuit and said first receiving terminal;

a second low-noise amplifier circuit disposed between said second diplexer circuit and said second receiving terminal for amplifying a received signal in said second frequency band;

a highpass filter circuit which is disposed in a line between said antenna terminal and said switch circuit and is coupled to the antenna terminal and an antenna side of the switch circuit; and a bandpass filter circuit which is disposed in a line between said second diplexer circuit and said second low-noise amplifier circuit, and is coupled to the second diplexer receiving terminal and an input of the second low-noise amplifier circuit, the highpass filter circuit and the bandpass filter circuit passing a received signal in said second frequency band while blocking at least a frequency band lower than said second frequency band, and a band blocked by said highpass filter circuit being lower than a band blocked by said bandpass filter circuit.

11. The high-frequency circuit according to claim 10, comprising a bandpass filter circuit between said first low-noise amplifier circuit and said first receiving terminal.

12. The high-frequency circuit according to claim 10, comprising bandpass filter circuits each between said first power amplifier circuit and said first transmission terminal, and between said second power amplifier circuit and said second transmission terminal.

13. The high-frequency circuit according to claim 10, comprising a voltage-applying terminal for applying constant voltage to said first and second power amplifier circuits, and a control circuit receiving voltage from said voltage-applying terminal and outputting a control bias voltage to said first and second power amplifier circuits.

14. The high-frequency circuit according to claim 13, wherein said control circuit outputs a control bias voltage for said first and second low-noise amplifier circuits.

15. The high-frequency circuit according to claim 10, wherein:
the highpass filter circuit is an only filter circuit disposed between the antenna and the switch circuit, thereby comprising the only filter circuit disposed on a common path by which the signals in the first frequency band and in the second frequency band are transmitted and received to and from the antenna, and
the bandpass filter circuit is an only filter circuit disposed between the second diplexer circuit and the second low-noise amplifier circuit, thereby comprising the only filter circuit disposed on a path by which the signals in the second frequency band are received by the switch circuit via the second diplexer receiving terminal.

16. A high-frequency circuit for wireless communications selectively using at least a first frequency band and a second frequency band lower than said first frequency band, comprising
an antenna terminal;
a first transmission terminal to which a transmitting signal in said first frequency band is input;
a second transmission terminal to which a transmitting signal in said second frequency band is input;
a first receiving terminal from which a received signal in said first frequency band is output;
a second receiving terminal from which a received signal in said second frequency band is output;
a diplexer circuit comprising a first transmission/receiving terminal and a second transmission/receiving terminal, for branching a signal input from said antenna terminal to a circuit for said first frequency band and a circuit for said second frequency band, and transmitting signals from circuits for said first and second frequency bands to said antenna terminal;
a first switch circuit disposed on the first frequency band circuit side of said diplexer circuit and comprising a first switch transmission terminal and a first switch receiving terminal for switching a transmission path and a receiving path;
a first power amplifier circuit disposed between said first switch circuit and said first transmission terminal;
a first low-noise amplifier circuit which is coupled to the first switch receiving terminal and disposed between said first switch circuit and said first receiving terminal;
a second switch circuit disposed on the second frequency band circuit side of said diplexer circuit and comprising a second switch transmission terminal and a second switch receiving terminal for switching a transmission path and a receiving path;
a second power amplifier circuit disposed between said second switch circuit and said second transmission terminal;
a second low-noise amplifier circuit which is coupled to the second switch receiving terminal and disposed between said second switch circuit and said second receiving terminal for amplifying a received signal in said second frequency band;
a highpass filter circuit which is disposed in a line between said antenna terminal and said diplexer circuit, and is coupled to the antenna terminal and an antenna side of the diplexer circuit; and
a bandpass filter circuit which is disposed in a line between said diplexer circuit and the second switch circuit, and is coupled to the second transmission/receiving terminal of the diplexer circuit and an antenna side of the second switch circuit,
the highpass filter circuit and the bandpass filter circuit passing a received signal in said second frequency band while blocking at least a frequency band lower than said second frequency band, and a band blocked by said highpass filter circuit being lower than a band blocked by said bandpass filter circuit.

17. The high-frequency circuit according to claim 16, comprising bandpass filter circuits each between said first power amplifier circuit and said first transmission terminal, and between said first low-noise amplifier circuit and said first receiving terminal.

18. The high-frequency circuit according to claim 17, comprising a voltage-applying terminal for applying constant voltage to said first and second power amplifier circuits, and a control circuit receiving voltage from said voltage-applying terminal and outputting a control bias voltage to said first and second power amplifier circuits.

19. The high-frequency circuit according to claim 18, wherein said control circuit outputs a control bias voltage to said first and second low-noise amplifier circuits.

20. The high-frequency circuit according to claim 16, wherein:
the highpass filter circuit is an only filter circuit disposed between said antenna terminal and said diplexer circuit, thereby comprising the only filter circuit disposed on a common path by which the signals in the first frequency band and in the second frequency band are transmitted and received to and from the antenna, and
the bandpass filter circuit is an only filter circuit disposed between said diplexer circuit and the second switch circuit, thereby comprising the only filter circuit disposed on a common path by which the signals in the second frequency band are transmitted and received between the highpass filter circuit and the second transmission and receiving terminals via the second transmission/receiving terminal of the diplexer circuit.

* * * * *